United States Patent
Arai et al.

(10) Patent No.: US 9,484,075 B2
(45) Date of Patent: Nov. 1, 2016

(54) SEMICONDUCTOR DEVICE

(71) Applicant: PS4 Luxco S.a.r.l., Luxembourg (LU)

(72) Inventors: Tetsuya Arai, Tokyo (JP); Kenji Asaki, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

(21) Appl. No.: 14/428,278

(22) PCT Filed: Sep. 11, 2013

(86) PCT No.: PCT/JP2013/074514
§ 371 (c)(1),
(2) Date: Mar. 13, 2015

(87) PCT Pub. No.: WO2014/042183
PCT Pub. Date: Mar. 20, 2014

(65) Prior Publication Data
US 2015/0235679 A1    Aug. 20, 2015

(30) Foreign Application Priority Data

Sep. 14, 2012   (JP) ................. 2012-203435

(51) Int. Cl.
*G11C 8/00* (2006.01)
*G11C 7/10* (2006.01)

(52) U.S. Cl.
CPC ................. *G11C 7/1057* (2013.01)

(58) Field of Classification Search
CPC ............ H03K 19/0005; H03K 19/018585; G11C 11/4093; G11C 29/022; G11C 29/028; G11C 29/50008; G11C 7/1057; H04L 25/0278; H04L 25/0272; H04L 25/0292; H04L 25/0298

USPC ......... 365/189.011, 230.08, 189.05, 189.08, 365/230.01, 230.03, 233.1, 239
See application file for complete search history.

(56) References Cited

U.S. PATENT DOCUMENTS

| 6,163,499 A | * | 12/2000 | Suzuki | ............ G01R 31/31701 |
| | | | | 365/189.05 |
| 6,278,300 B1 | | 8/2001 | Urakawa | |
| 8,766,664 B2 | * | 7/2014 | Yokou | ................. G11C 5/147 |
| | | | | 326/30 |
| 2008/0284465 A1 | * | 11/2008 | Kao | ................. H04L 25/0278 |
| | | | | 326/30 |

(Continued)

FOREIGN PATENT DOCUMENTS

| JP | H2-105247 A | 4/1990 |
| JP | H11-85345 A | 3/1999 |

(Continued)

OTHER PUBLICATIONS

International Search Report (ISR) (PCT Form PCT/ISA/210), in PCT/JP2013/074514, dated Nov. 5, 2013.

*Primary Examiner* — Fernando Hidalgo
(74) *Attorney, Agent, or Firm* — Kunzler Law Group, PC

(57) ABSTRACT

A semiconductor device includes data terminal, unit buffers which drive the data terminal and the impedance of which can be adjusted, and control circuits which successively switch the operation of at least two unit buffers selected from unit buffers. Because the operation of the plurality of unit buffers is switched successively, the peak current which flows during an output operation is dispersed, power-supply noise can be controlled, and the output potential can be switched very rapidly and continuously, while a fixed output impedance is maintained.

13 Claims, 41 Drawing Sheets

(56) References Cited

U.S. PATENT DOCUMENTS

2011/0062984 A1 3/2011 Kuwahara et al.
2012/0119578 A1* 5/2012 Kuwahara ............... G11C 5/063
 307/43
2013/0094321 A1* 4/2013 Shido ....................... G11C 8/10
 365/230.06

FOREIGN PATENT DOCUMENTS

| JP | 2000-068816 A | 3/2000 |
| JP | 2000-134084 A | 5/2000 |
| JP | 2001-085986 A | 3/2001 |
| JP | 2001-168704 A | 6/2001 |
| JP | 2006-203405 A | 8/2006 |
| JP | 2008-060679 A | 3/2008 |
| JP | 2011-041209 A | 2/2011 |
| JP | 2011-061580 A | 3/2011 |
| JP | 2012-105126 A | 5/2012 |
| WO | WO 2011/021359 A1 | 2/2011 |

\* cited by examiner

Figure 16

|  | | Unit buffer | | | | | | |
|---|---|---|---|---|---|---|---|---|
|  | | 101 | 102 | 103 | 104 | 105 | 106 | 107 |
| Number activated (Output impedance) | 7 (34.3Ω) | 0 | 1 | 2 | 3 | 4 | 5 | 6 |
| | 6 (40Ω) | 0 | 1 | 2 | 3 | 4 | 5 | - |
| | 5 (48Ω) | 0 | 1 | 2 | 3 | 4 | - | - |
| | 4 (60Ω) | 0 | 2 | 4 | 6 | - | - | - |
| | 3 (80Ω) | 0 | 3 | 6 | - | - | - | - |
| | 2 (120Ω) | 0 | 6 | - | - | - | - | - |

Figure 19

| Number activated (Output impedance) | Decoding signal | | | | | Unit delay | | | Unit buffer | | | | | | |
|---|---|---|---|---|---|---|---|---|---|---|---|---|---|---|---|
| | a | b | c | d | e | A | B | C | 101 | 102 | 103 | 104 | 105 | 106 | 107 |
| 7 (34.3Ω) | ○ | - | - | - | - | 1 | 1 | 1 | 0 | 1 | 2 | 3 | 4 | 5 | 6 |
| 6 (40Ω) | ○ | - | - | - | - | 1 | 1 | 1 | 0 | 1 | 2 | 3 | 4 | 5 | - |
| 5 (48Ω) | ○ | - | - | - | - | 1 | 1 | 1 | 0 | 1 | 2 | 3 | 4 | - | - |
| 4 (60Ω) | - | - | ○ | ○ | - | 2 | 2 | - | 0 | 2 | 4 | 6 | - | - | - |
| 3 (80Ω) | - | ○ | - | ○ | - | 3 | 3 | - | 0 | 3 | 6 | - | - | - | - |
| 2 (120Ω) | - | - | ○ | - | ○ | 6 | - | - | 0 | 6 | - | - | - | - | - |

Figure 25

| Number activated (Output impedance) | Decoding signal | | | | | | Unit buffer | | | | | | |
|---|---|---|---|---|---|---|---|---|---|---|---|---|---|
| | 412 | 413 | 414 | 415 | 416 | 417 | 101 | 102 | 103 | 104 | 105 | 106 | 107 |
| 7 (34.3Ω) | - | - | - | O | O | O | 0 | 1 | 2 | 3 | 4 | 5 | 6 |
| 6 (40Ω) | - | - | - | O | O | - | 0 | 1 | 2 | 3 | 4 | 5 | - |
| 5 (48Ω) | - | - | - | O | - | - | 0 | 1 | 2 | 3 | 4 | - | - |
| 4 (60Ω) | - | - | O | - | - | - | 0 | 2 | 4 | 6 | - | - | - |
| 3 (80Ω) | - | O | - | - | - | - | 0 | 3 | 6 | - | - | - | - |
| 2 (120Ω) | O | - | - | - | - | - | 0 | 6 | - | - | - | - | - |

SEMICONDUCTOR DEVICE

TECHNICAL FIELD

The present invention relates to a semiconductor device, and in particular relates to a semiconductor device provided with a plurality of unit buffers connected in parallel to data terminals.

BACKGROUND ART

Semiconductor devices such as DRAM (Dynamic Random Access Memory) are sometimes configured in such a way that the impedance of an output buffer circuit can be switched according to an operating mode. For example in semiconductor devices described in patent literature articles 1 and 2, an output buffer circuit is configured from a plurality of unit buffers having the same impedance as each other, and the impedance can be switched by selecting the number of unit buffers to activate. With the semiconductor devices described in patent literature articles 1 and 2, because each unit buffer has the same impedance, a calibration operation to adjust the impedance of the unit buffers can be executed in one batch.

PRIOR ART LITERATURE

Patent Literature

Patent literature article 1: Japanese Patent Kokai 2006-203405
Patent literature article 2: Japanese Patent Kokai 2008-60679
Patent literature article 3: Japanese Patent Kokai 2000-68816

SUMMARY OF THE INVENTION

Problems to be Resolved by the Invention

However, with the semiconductor devices described in patent literature articles 1 and 2, because the selected unit buffers are activated simultaneously, the peak current that flows during the output operation increases as the number of activated unit buffers increases, and significant power-supply noise is sometimes generated.

However, although unrelated to unit buffers in which the impedance can be adjusted by means of a calibration operation, patent literature article 3 discloses a semiconductor device in which the DC level of an output signal can be controlled arbitrarily by causing signals, each having a prescribed logic level, to be output from a plurality of buffers having mutually different impedances. Therefore an arbitrary waveform can be formed by switching the DC level of the output signal in stages. However, with the semiconductor device described in patent literature article 3, because a binary-format weighting is applied to the impedance of each buffer, it is necessary to switch the value of a binary-format signal very rapidly and continuously in order to create an arbitrary waveform, and this is not practical for high-speed data transfer.

Means of Overcoming the Problems

A semiconductor device according to one aspect of the present invention is characterized in that it comprises: a data terminal, a plurality of unit buffers which drive the data terminal and the impedance of which can be adjusted, and a control circuit which successively switches the operation of at least two unit buffers selected from the plurality of unit buffers.

A semiconductor device according to another aspect of the present invention is characterized in that it comprises: a data terminal; a plurality of unit buffers which in a first control state drive the data terminal to a first logic level, in a second control state drive the data terminal to a second logic level that is different from the first logic level, and in a third control state adopt a high-impedance state as seen from the data terminal; a selection circuit which sets two or more unit buffers selected from the plurality of unit buffers to either one of the first and second control states, and sets the remaining unit buffers that have not been selected to the third control state; and a control circuit which successively switches the selected unit buffers from said one of the first and second control states to the other of the first and second control states.

A semiconductor device according to yet another aspect of the present invention is characterized in that it comprises: 1st to nth unit buffers commonly connected to a data terminal; a control circuit which switches an output logic level of the 1st to the mth (where m is an integer at least equal to 2 and at most equal to n) unit buffers in succession; and a code-generating circuit which specifies the value of m.

Advantages of the Invention

According to the present invention, because the operation of the plurality of unit buffers is switched successively, the peak current flowing during an output operation is dispersed, power-supply noise can be controlled, and the impedance can be switched very rapidly and continuously.

BRIEF EXPLANATION OF THE DRAWINGS

FIG. 16 is a table used to describe the relationship between the number of unit buffers 101 to 107 to be activated and the timing with which the operation thereof is switched.

FIG. 19 is a table illustrating the relationship between the number of unit buffers 101 to 107 to be activated and the decoding signals a to e to be activated.

FIG. 25 is a table illustrating the relationship between the number of unit buffers 101 to 107 to be activated and the decoding signals 412 to 417 to be activated.

MODES OF EMBODYING THE INVENTION

Preferred modes of embodiment of the present invention will now be described in detail with reference to the accompanying drawings.

Figure 1:
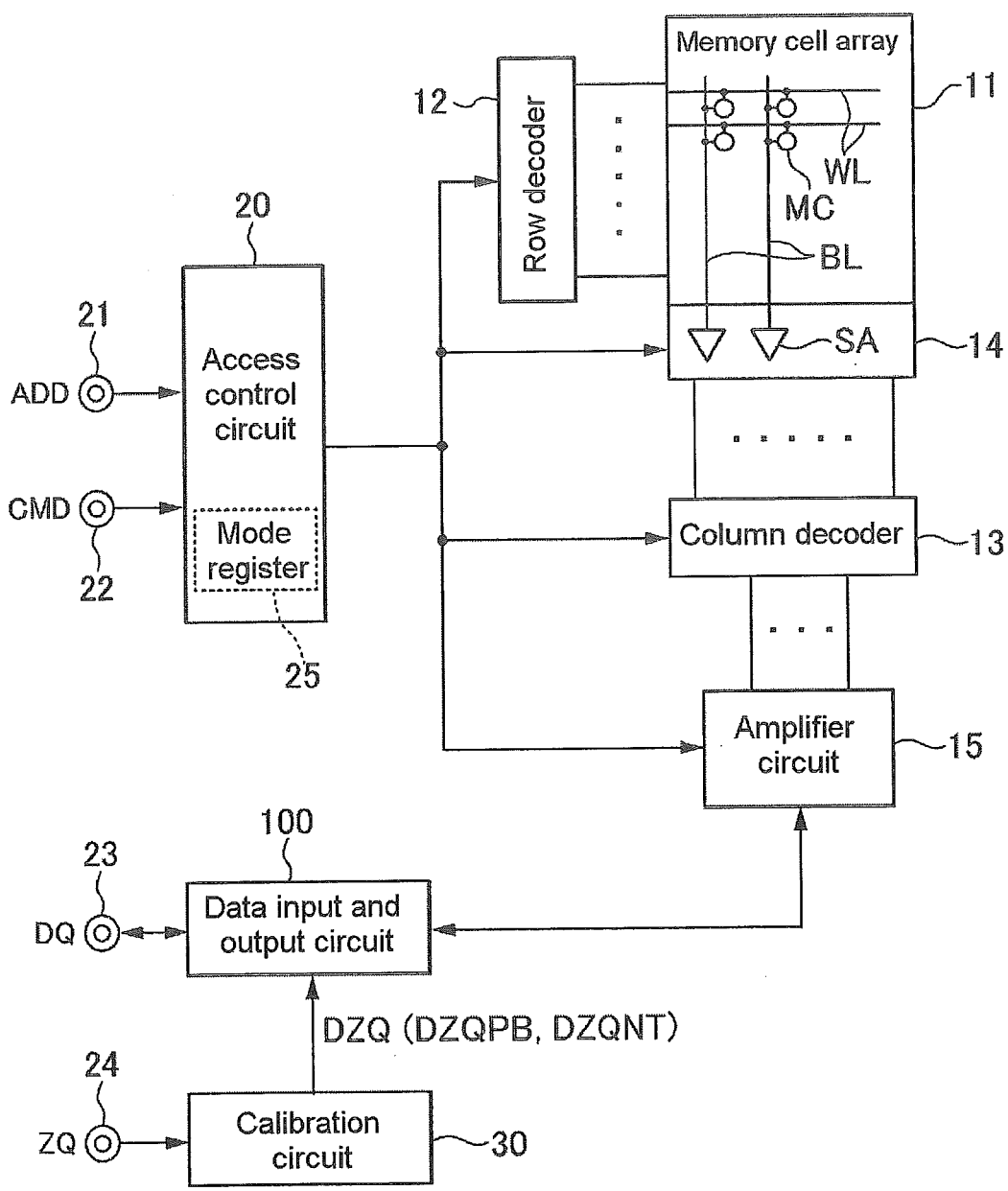
FIG. 1 is a block diagram illustrating the overall configuration of a semiconductor device 10 according to a preferred mode of embodiment of the present invention.

FIG. 1 is a block diagram illustrating the overall configuration of a semiconductor device 10 according to a preferred mode of embodiment of the present invention.

The semiconductor device 10 according to this mode of embodiment is a DRAM, and as illustrated in FIG. 1 it is provided with a memory cell array 11. The memory cell array 11 is provided with a plurality of word lines WL and a plurality of bit lines BL which intersect each other, and memory cells MC are disposed at the points of intersection. The word lines WL are selected using a row decoder 12, and the bit lines BL are selected using a column decoder 13. The bit lines BL are connected respectively to corresponding sense amplifiers SA in a sensing circuit 14, and the bit lines BL selected by the column decoder 13 are connected to an amplifier circuit 15 by way of the sense amplifiers SA.

Operation of the row decoder 12, the column decoder 13, the sensing circuit 14 and the amplifier circuit 15 is controlled by means of an access control circuit 20. An address signal ADD and a command signal CMD are supplied from the outside to the access control circuit 20 via an address terminal 21 and a command terminal 22 respectively. The access control circuit 20 receives address signals ADD and command signals CMD, and controls the row decoder 12, the column decoder 13, the sensing circuit 14 and the amplifier circuit 15 on the basis of these signals.

More specifically, if the command signal CMD indicates an active operation for the semiconductor device 10, then the address signal ADD is supplied to the row decoder 12. In response, the row decoder 12 selects the word line WL indicated by the address signal ADD, causing the corresponding memory cells MC to be connected respectively to the bit lines BL. The access control circuit 20 then activates the sensing circuit 14 with a prescribed timing.

However, if the command signal CMD indicates a read operation or a write operation for the semiconductor device 10, then the address signal ADD is supplied to the column decoder 13. In response, the column decoder 13 connects the bit lines BL indicated by the address signal ADD to the amplifier circuit 15. By this means, during a read operation, read data DQ that have been read from the memory cell array 11 via the sense amplifiers SA are output to the outside from a data terminal 23 via the amplifier circuit 15 and a data input and output circuit 100. Further, during a write operation, write data DQ that have been supplied from the outside via the data terminal 23 are written to the memory cells MC via the data input and output circuit 100, the amplifier circuit 15 and the sense amplifiers SA.

As discussed hereinbelow, the data input and output circuit 100 contains a plurality of unit buffers which have the same impedance as each other when operating. The impedance of the unit buffers is controlled by means of a calibration circuit 30. The calibration circuit 30 is connected to a calibration terminal (ZQ) 24.

Figure 2:
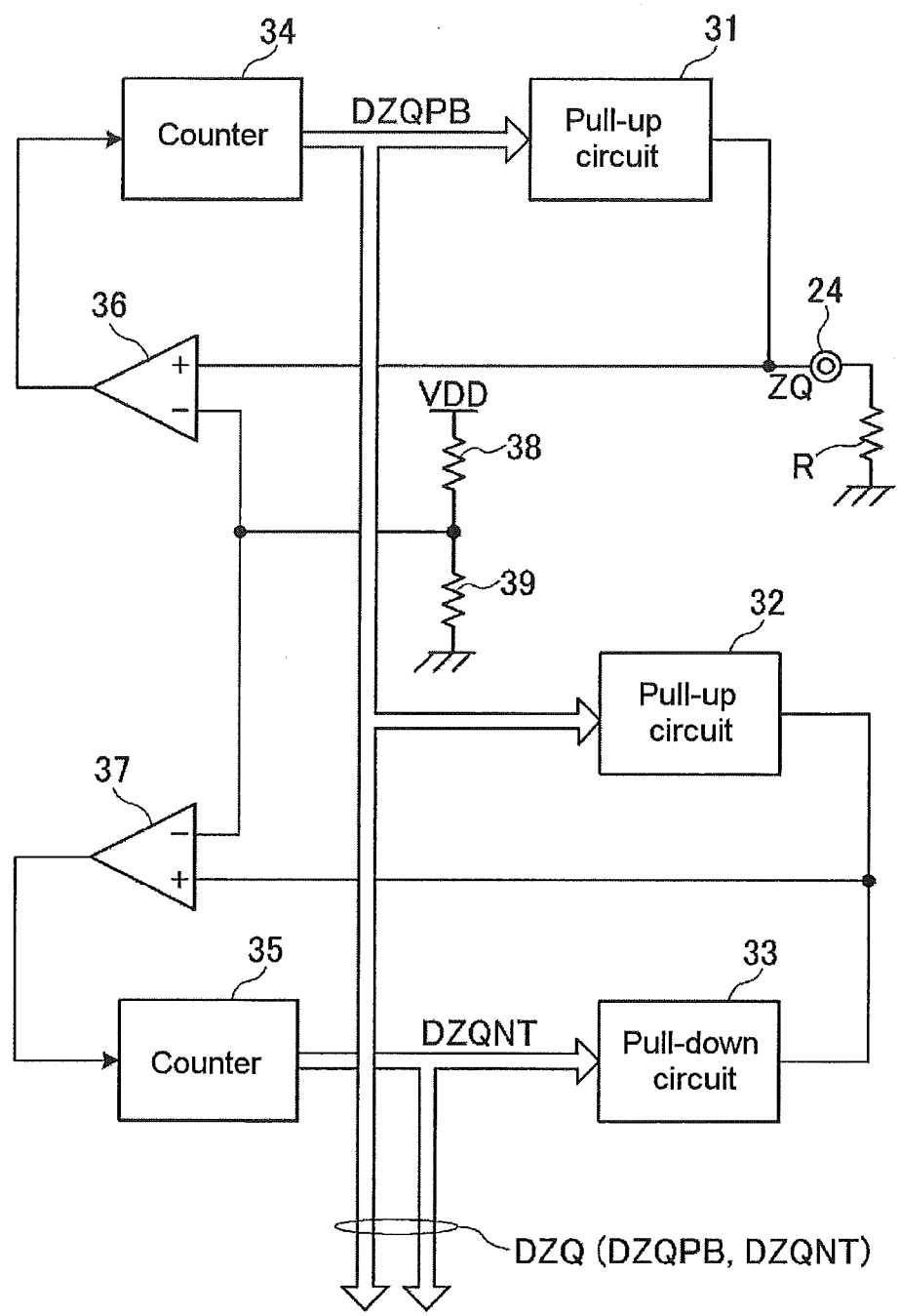
FIG. 2 is a circuit diagram of a calibration circuit 30.

FIG. 2 is a circuit diagram of the calibration circuit 30.

As illustrated in FIG. 2, the calibration circuit 30 comprises pull-up replica circuits 31 and 32, a pull-down replica circuit 33, a counter circuit 34 which controls the operation of the pull-up replica circuits 31 and 32, a counter circuit 35 which controls the operation of the pull-down replica circuit 33, a comparator 36 which controls the counter circuit 34, and a comparator 37 which controls the counter circuit 35. More specifically, the counter circuit 34 changes the impedance of the pull-up replica circuits 31 and 32 by changing its own count value. The comparator 36 stops the counting operation of the counter circuit 34 when the potential of the calibration terminal 24 becomes equal to a reference potential, in other words when the impedance of the pull-up replica circuit 31 becomes equal to the impedance of a resistor R. The reference potential is generated by resistors 38 and 39. The count value of the counter circuit 34 is used as an impedance adjustment code DZQPB which is fed back to the pull-up replica circuits 31 and 32 and is supplied to the data input and output circuit 100 illustrated in FIG. 1. At the same time, the impedance of the pull-down replica circuit 33 is also adjusted by means of the counter circuit 35 and the comparator 37, and the count value of the counter circuit 35 is used as an impedance adjustment code DZQNT which is fed back to the pull-down replica circuit 33 and is supplied to the data input and output circuit 100 illustrated in FIG. 1. The impedance adjustment codes DZQPB and DZQNT are each multi-bit signals.

Figure 3:
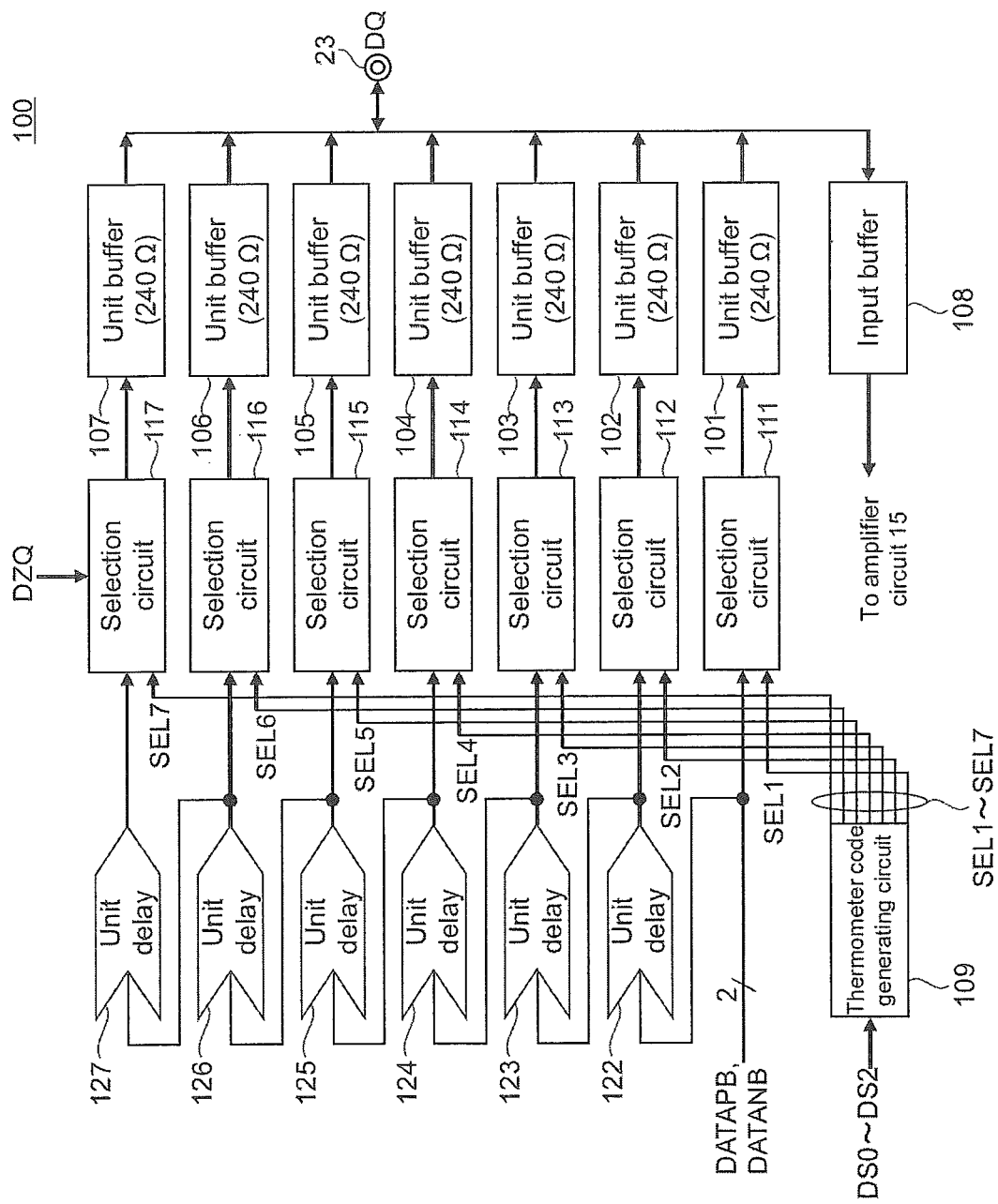
FIG. 3 is a circuit diagram of a data input and output circuit 100 according to a first mode of embodiment of the present invention.

FIG. 3 is a circuit diagram of the data input and output circuit 100 according to the first mode of embodiment of the present invention.

The data input and output circuit 100 illustrated in FIG. 3 comprises seven unit buffers 101 to 107 which are connected to the data terminal 23, and an input buffer 108. The input buffer 108 is a buffer used during a write operation, but as it is not directly related to the gist of the present invention a description thereof is omitted.

The unit buffers 101 to 107 are buffers used during a read operation, and their impedance when activated is adjusted to 240Ω by means of an impedance adjustment code DZQ. Therefore if m of the unit buffers 101 to 107 are activated, the output impedance is 240 Ω/m, and the output impedance during a read operation can thus be selected in 7 levels. The output impedance is specified by setting prescribed mode signals DS0 to DS2 in a mode register 25 contained in the access control circuit 20.

The mode signals DS0 to DS2 set in the mode register 25 are supplied to a thermometer code generating circuit 109 illustrated in FIG. 3. The thermometer code generating circuit 109 is a circuit which generates thermometer codes SEL1 to SEL7 by decoding the mode signals DS0 to DS2. The generated thermometer codes SEL1 to SEL7 are supplied respectively to corresponding selection circuits 111 to 117. It should be noted that a 'thermometer code' is not information related to temperature, but refers to a code having a format in which positions on one side of an indicated value are all in an active state, and positions on the other side are all in an inactive state, as in a thermometer.

Figure 4:
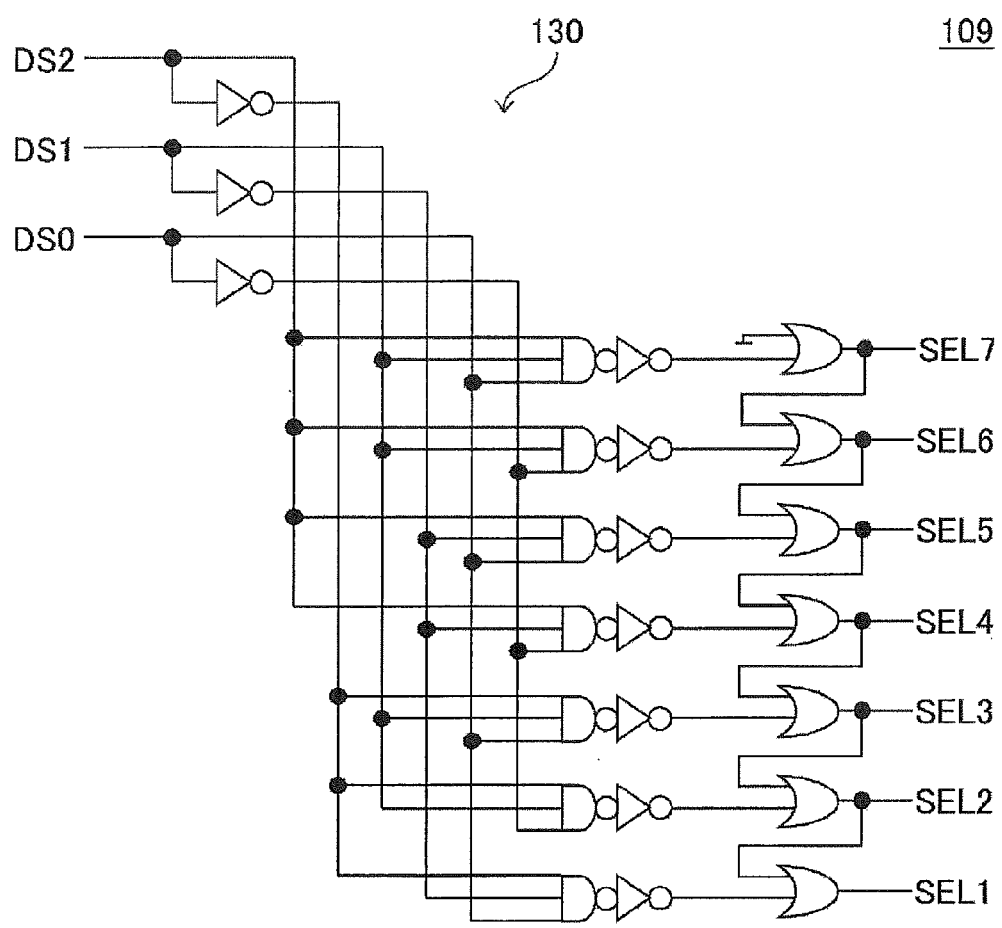
FIG. 4 is a circuit diagram of a thermometer code generating circuit 109 according to a first example.

FIG. 4 is a circuit diagram of the thermometer code generating circuit 109 according to a first example.

The thermometer code generating circuit 109 illustrated in FIG. 4 comprises a decoder 130 which decodes the mode signals DS0 to DS2, and OR gate circuits 131 to 137 which respectively receive the output signals from the decoder 130, the output signals from these OR gate circuits 131 to 137 constituting the thermometer codes SEL1 to SEL7. As illustrated in FIG. 4, the signal from each OR gate circuit 132 to 137 is supplied respectively to the OR gate circuit 131 to 136 on the lower side thereof, and thus if a certain OR gate circuit is selected by the decoder 130, the output signals from all of the OR gate circuits on the lower side thereof are activated to the high-level state. For example, if the OR gate circuit 135 is selected by the decoder 130, the thermometer code SEL5 is activated to the high-level state, and the thermometer codes SEL1 to SEL4 output from the OR gate circuits 131 to 134 on the lower side thereof are also all activated to the high-level state. In this case, the thermometer codes SEL6 and SEL7 are in the inactive low-level state.

Figure 5:
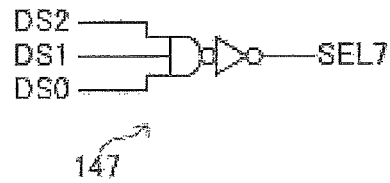
FIG. 5 is a circuit diagram of a thermometer code generating circuit 109 according to a second example.
Figure 5:
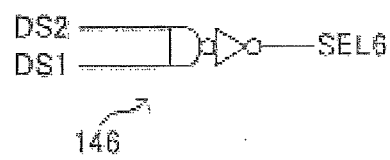
Figure 5:
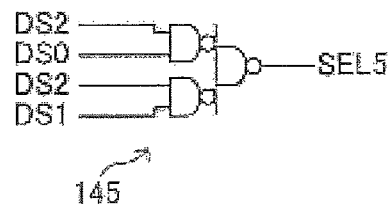
Figure 5:
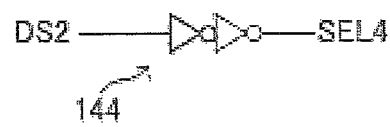
Figure 5:
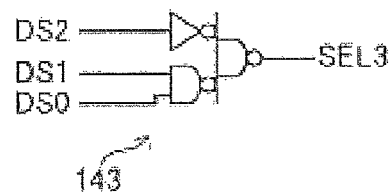
Figure 5:
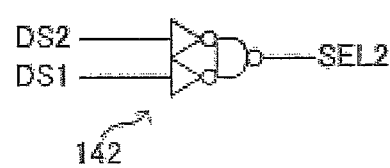
Figure 5:
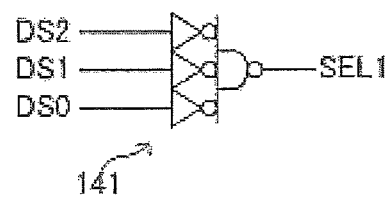

FIG. 5 is a circuit diagram of a thermometer code generating circuit 109 according to a second example.

The thermometer code generating circuit 109 illustrated in FIG. 5 comprises logic gate circuits 141 to 147 which respectively output thermometer codes SEL1 to SEL7. The logic gate circuits 141 to 147 activate the corresponding thermometer codes SEL1 to SEL7 if the values of the mode signals DS0 to DS2 are respectively equal to or greater than a corresponding value. The relationship between the values of the mode signals DS0 to DS2 and the activated thermometer codes SEL1 to SEL7 is the same as with the thermometer code generating circuit 109 illustrated in FIG. 4.

The thermometer codes SEL1 to SEL7 generated in this way are supplied respectively to the selection circuits 111 to 117 as illustrated in FIG. 3. The selection circuits 111 to 117 correspond respectively to the unit buffers 101 to 107, and they select whether the corresponding unit buffers 101 to 107 are to be active or inactive, and if the corresponding unit buffer is to be in an active state, the selection circuits 111 to 117 also set the output impedance. The selection circuits 111 to 117 are supplied with internal data DATAPB and DATANB which define the output logic level if the state is active. The internal data DATAPB is a low-active signal which controls pull-up circuits contained in the unit buffers 101 to 107. On the other hand, the internal data DATANB is a high-active signal which controls pull-down circuits contained in the unit buffers 101 to 107.

Figure 6:
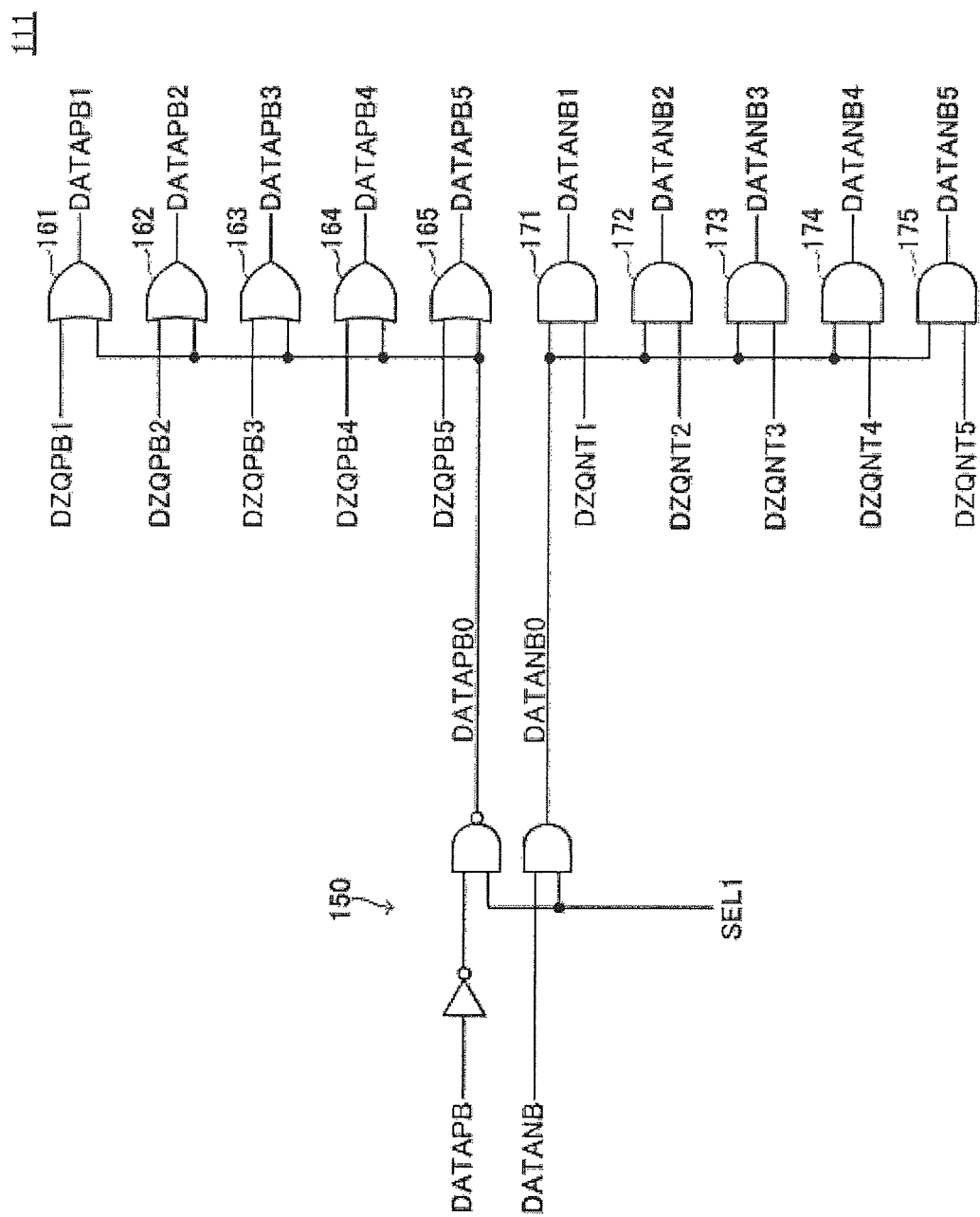
FIG. 6 is a circuit diagram of a selection circuit 111.

FIG. 6 is a circuit diagram of the selection circuit 111.

As illustrated in FIG. 6, the selection circuit 111 comprises a logic gate circuit 150 which generates internal data DATAPB0 and DATANB0 on the basis of the thermometer code SEL1 and the internal data DATAPB and DATANB. If the thermometer code SEL1 is in the active high-level state, then the logic gate circuit 150 generates the internal data DATAPB0 and DATANB0 by allowing the internal data DATAPB and DATANB to pass through without modification, but if the thermometer code SEL1 is in the inactive low-level state, then the internal data DATAPB0 and DATANB0 are set to the inactive high-level state and the inactive low-level state respectively, irrespective of the logic levels of the internal data DATAPB and DATANB.

The internal data DATAPB0 is supplied to one of the input nodes of OR gate circuits 161 to 165. Bits DZQPB1 to DZQPB5 which form the impedance adjustment code DZQPB are supplied respectively to the other input nodes of the OR gate circuits 161 to 165. The output signals from the OR gate circuits 161 to 165 are used respectively as internal data DATAPB1 to DATAPB5. Similarly, the internal data DATANB0 is supplied to one of the input nodes of AND gate circuits 171 to 175. Bits DZQNT1 to DZQNT5 which form the impedance adjustment code DZQNT are supplied respectively to the other input nodes of the AND gate circuits 171 to 175. The output signals from the AND gate circuits 171 to 175 are used respectively as internal data DATANB1 to DATANB5.

The other selection circuits 112 to 117 have the same circuit configuration as the selection circuit 111 illustrated in FIG. 6, except that they are supplied with the thermometer codes SEL2 to SEL7 respectively. The internal data DATAPB1 to DATAPB5 and DATANB1 to DATANB5 output by the selection circuits 111 to 117 are then supplied respectively to the corresponding unit buffers 101 to 107. It should be noted that in the present invention, some or all of the elements contained in the data input and output circuit, excluding the unit buffers, are sometimes referred to as a 'control circuit'.

Figure 7:
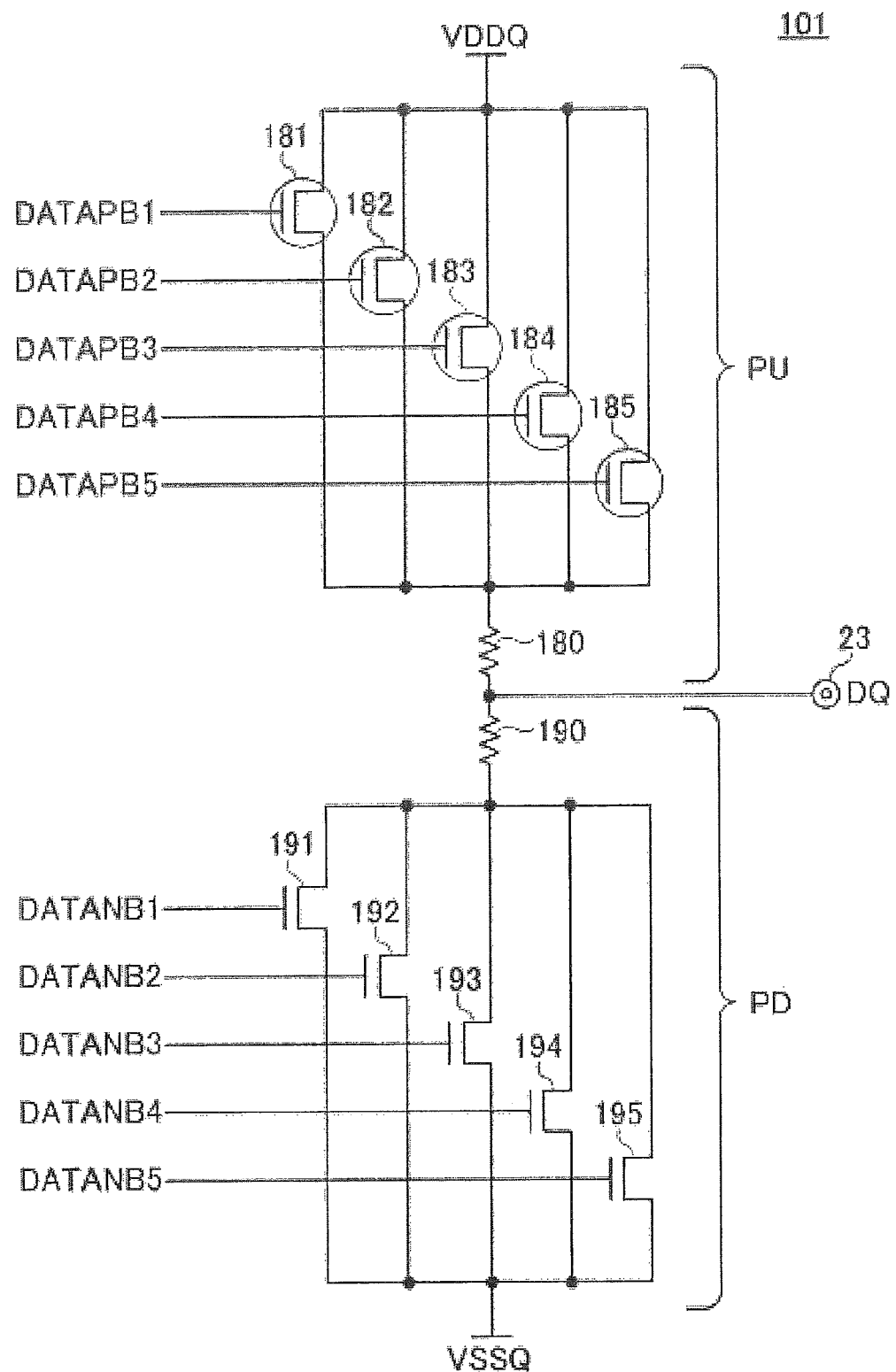
FIG. 7 is a circuit diagram of a unit buffer 101.

FIG. 7 is a circuit diagram of the unit buffer 101.

As illustrated in FIG. 7, the unit buffer 101 comprises a plurality (five in this mode of embodiment) of P-channel MOS transistors 181 to 185 connected in parallel, a plurality (five in this mode of embodiment) of N-channel MOS transistors 191 to 195 connected in parallel, and resistors 180 and 190 connected in series between the transistors 181 to 185 and the transistors 191 to 195, the point of connection between the resistor 180 and the resistor 190 being connected to the data terminal 23. In the unit buffer 101, the section comprising the transistors 181 to 185 and the resistor 180 forms a pull-up circuit PU, and the section comprising the transistors 191 to 195 and the resistor 190 forms a pull-down circuit PD.

The internal data DATAPB1 to DATAPB5 are supplied respectively to the gate electrodes of the transistors 181 to 185, which are thus individually controlled to be on or off. By means of this on/off control, the impedance due to the MOS transistor portion of the pull-up circuit PU is adjusted to 120Ω, for example. The resistance of the resistor 180 is 120Ω, and therefore the output impedance during a pull-up operation is 240Ω. Similarly, the internal data DATANB1 to DATANB5 are supplied respectively to the gates of the transistors 191 to 195, which are thus individually controlled to be on or off. By means of this on/off control, the impedance due to the MOS transistor portion of the pull-down circuit PD is adjusted to 120Ω, for example. The resistance of the resistor 190 is 120Ω, and therefore the output impedance during a pull-down operation is 240 Ω.

Returning to FIG. 3, the internal data DATAPB and DATANB are not supplied simultaneously to the selection circuits 111 to 117, but rather the internal data DATAPB and DATANB delayed by means of the unit delays 122 to 127 are supplied successively to the selection circuits 111 to 117. In other words, the internal data DATAPB and DATANB are supplied successively to the selection circuits 111 to 117. Therefore the operational states of the unit buffers 101 to 107 selected by the thermometer codes SEL1 to SEL7 are switched successively.

If, for example, the thermometer codes SEL1 to SEL3 are in the high-level state and the thermometer codes SEL4 to SEL7 are in the low-level state, then the unit buffers 101 to 103 are set to the active state, and the unit buffers 104 to 107 are set to the inactive state (high-impedance state). Here, if we assume a condition in which the internal data DATAPB and DATANB are in the high-level state, and therefore low-level data are being output from the unit buffers 101 to 103, then if the internal data DATAPB and DATANB change from the high-level state to the low-level state, the output logic levels of the unit buffers 101 to 103 will switch successively from the low-level state to the high-level state.

Figure 8:
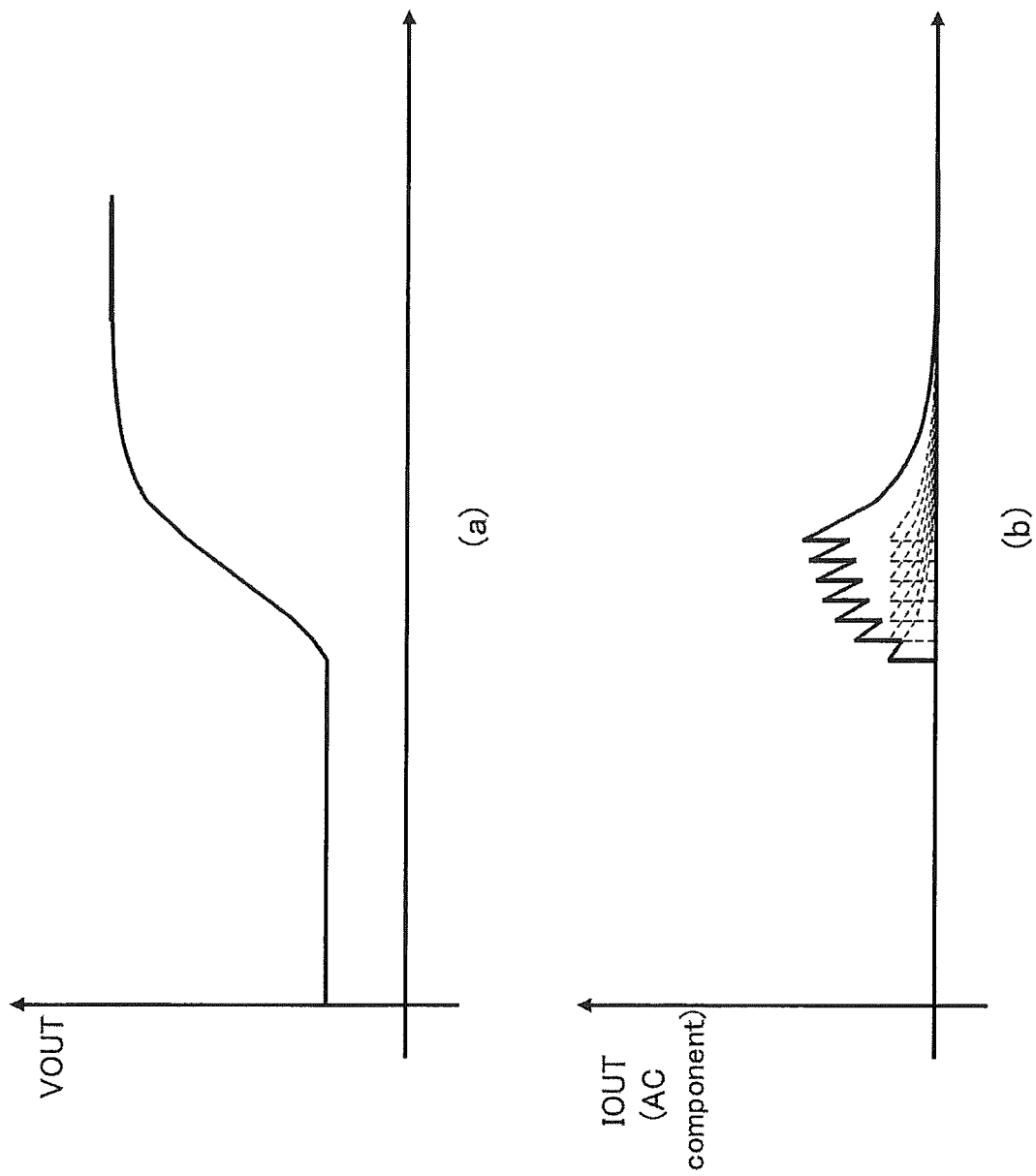
FIG. 8 is a waveform diagram used to describe the effects of the first mode of embodiment, where (a) is a voltage waveform VOUT from a data terminal 23 and (b) is a consumption current IOUT (AC component) flowing through the unit buffers 101 to 107.

By this means the peak current is significantly reduced compared with a case in which the selected unit buffers 101 to 107 are switched simultaneously. FIG. 8 is a waveform diagram used to describe the effects of this mode of embodiment, where (a) is a voltage waveform VOUT from the terminal 23 and (b) is a consumption current IOUT (AC component) flowing through the unit buffers 101 to 107. The waveforms represented by the dashed lines in FIG. 8 (b) are the currents consumed by each unit buffer 101 to 107, and the waveform represented by the solid line is the total current consumed by the unit buffers 101 to 107. In this mode of embodiment, as illustrated in FIG. 8, even if the operation of all seven unit buffers 101 to 107 is switched, it can be seen that the unit buffers 101 to 107 do not switch simultaneously but successively, and therefore the peak consumed current is suppressed.

Figure 9:
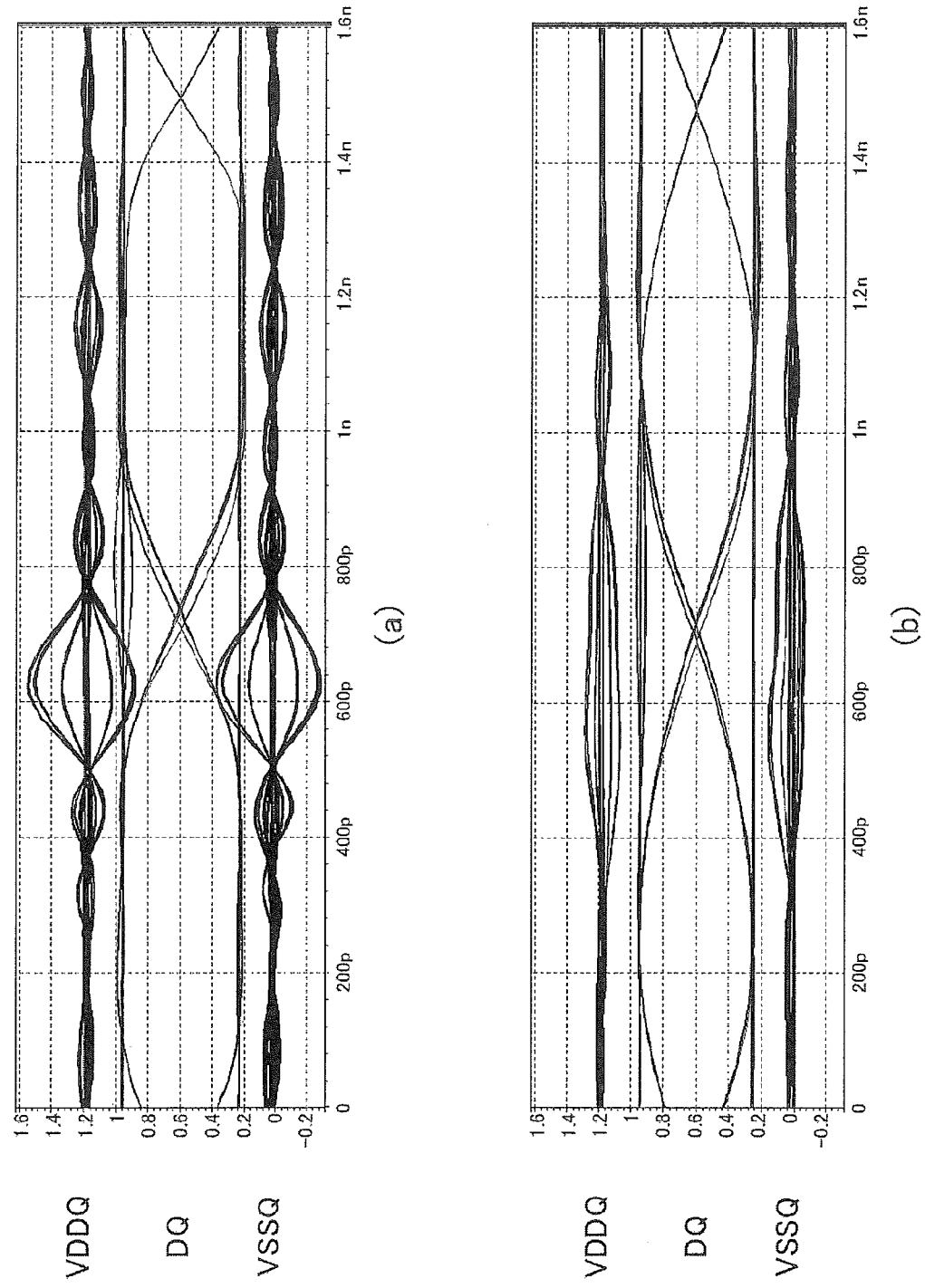
FIG. 9 is a waveform diagram illustrating the variations in the potentials of the data terminal 23 and of power-supply potentials VDDQ and VSSQ, where (a) illustrates a case in which the operation of the unit buffers 101 to 107 is switched simultaneously, and (b) illustrates a case in which the operation of the unit buffers 101 to 107 is switched successively.

FIG. 9 is a waveform diagram illustrating the variations in the potentials of the data terminal 23 and of power-supply potentials VDDQ and VSSQ, where (a) illustrates a case in which the operation of the unit buffers 101 to 107 is switched simultaneously, and (b) illustrates a case in which the operation of the unit buffers 101 to 107 is switched successively. As illustrated in FIG. 9 (a), if the operation of the unit buffers 101 to 107 is switched simultaneously, the power-supply potentials VDDQ and VSSQ fluctuate greatly during the first half of the period of transition of the read data DQ output from the data terminal 23. In contrast, if, as illustrated in FIG. 9 (b), the operation of the unit buffers 101 to 107 is switched successively, it can be seen that the fluctuations in the power-supply potentials VDDQ and VSSQ are dispersed over the entire period of transition of the read data DQ, and as a result the amount of fluctuation is greatly suppressed.

Thus according to this mode of embodiment, the operation of the unit buffers 101 to 107 is switched successively, and therefore the peak current consumption can be suppressed, and momentary fluctuations in the power-supply potentials VDDQ and VSSQ can be suppressed. Further, the time lag between the timings of the operations of the unit buffers 101 to 107 is determined by the amount of delay in the unit delays 122 to 127, and therefore the time lag can be set arbitrarily, irrespective of the clock frequency, for example.

Further, in this mode of embodiment the output impedance during the transition of the read data DQ is fixed, whichever value the output impedance is set to, and therefore the reflection coefficient during the transition is also fixed. This makes it possible to prevent reflection of a complex signal on a transmission line connected to the data terminal 23.

Figure 10:
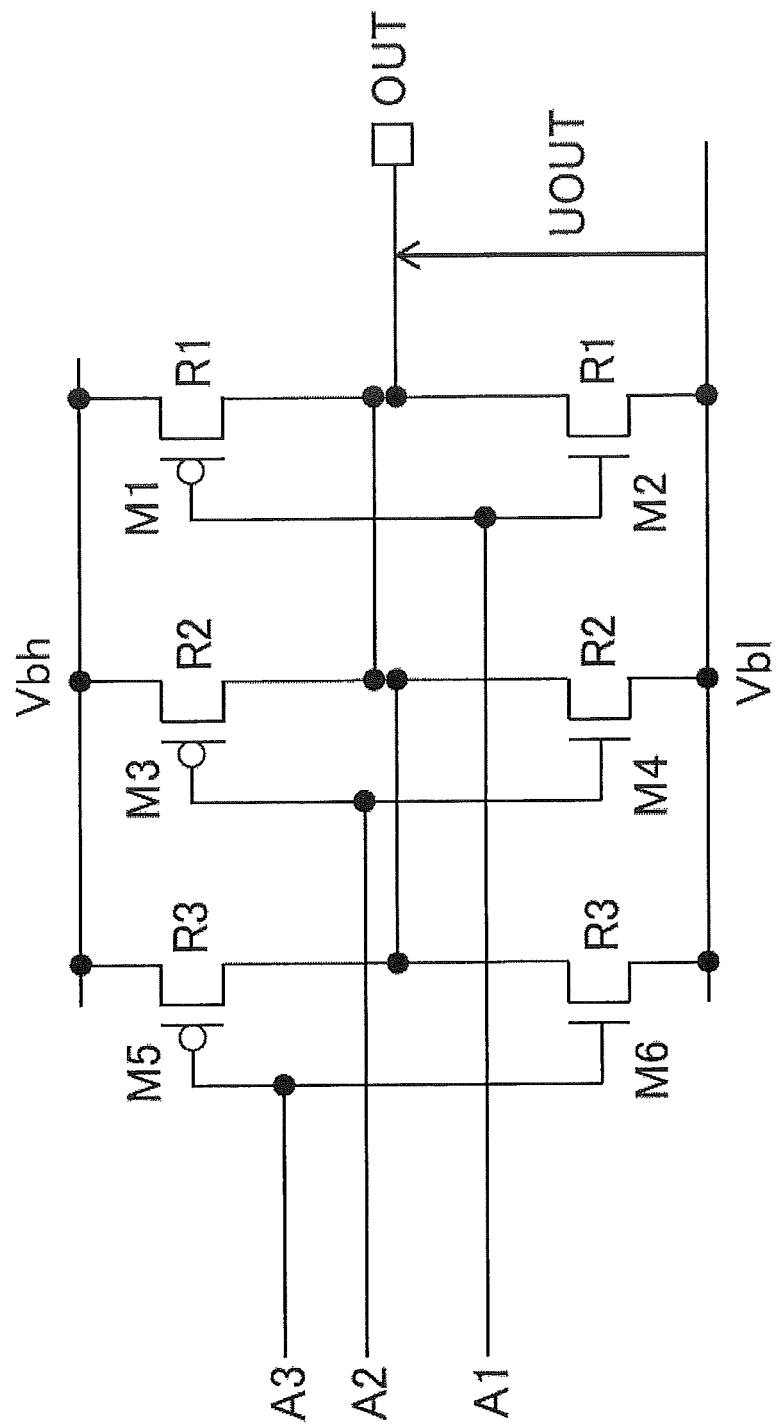
FIG. 10 is a circuit diagram of a conventional output buffer.

FIG. 10 is a circuit diagram of a conventional output buffer described in patent literature article 3.

The output buffer illustrated in FIG. 10 comprises transistors M1 to M6 connected between a power source wiring line supplying a high-side potential Vbh and a power source wiring line supplying a low-side potential Vbl, and the point of connection between the transistors M1 and M2, the point of connection between the transistors M3 and M4, and the point of connection between the transistors M5 and M6 are commonly connected to an output terminal OUT. A control signal A1 is supplied to the gate electrodes of the transistors M1 and M2, a control signal A2 is supplied to the gate electrodes of the transistors M3 and M4, and a control signal A3 is supplied to the gate electrodes of the transistors M5 and M6.

Here, if we let the ON resistance of the transistors M1 and M2 be R1, the ON resistance of the transistors M3 and M4 be R2, and the ON resistance of the transistors M5 and M6 be R3, then they are designed such that:

$$R1=2\times R2=4\times R3$$

Figure 11:
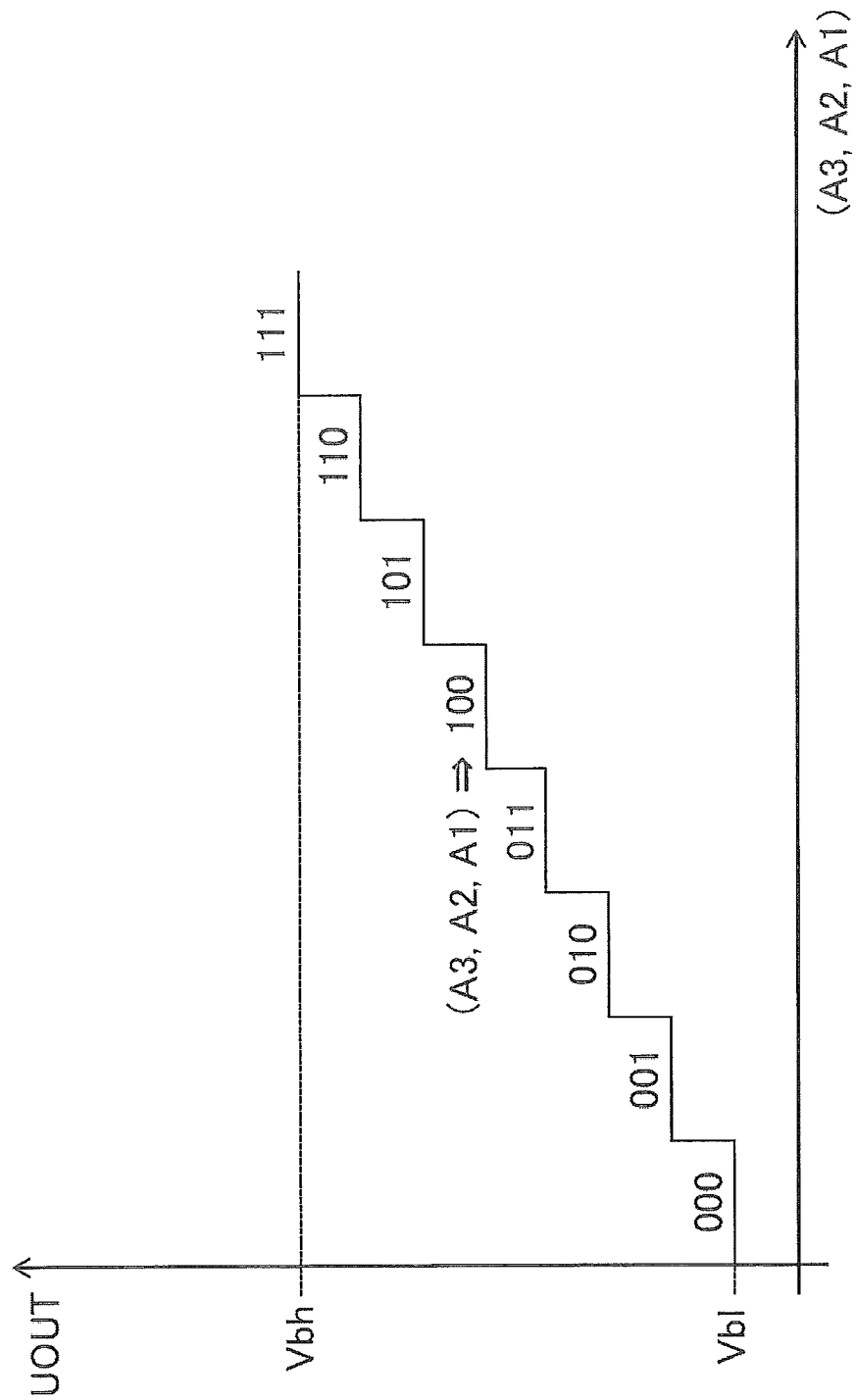
FIG. 11 is a drawing illustrating the potential of an output terminal OUT obtained in accordance with the value of a control signal (A3, A2, A1).

In other words, weightings of a power of 2 are applied to the resistors R1 to R3, and therefore the potential at the output terminal OUT can be controlled to eight levels in accordance with the values of the control signals (A3, A2, A1), as illustrated in FIG. 11. Further, the resistance of the output buffer as seen from the output terminal OUT is fixed, with no dependency on the values of the control signals (A3, A2, A1), as per the following formula, and the reflection coefficient as seen from the output terminal is also fixed.

$$R_3 // R_2 // R_1 = \frac{R_1 R_2 R_3}{R_1 R_2 + R_2 R_3 + R_3 R_1} \quad \text{[Formula 1]}$$
$$= \text{const.}$$
$$= \frac{4}{7} R_3 \left( = \frac{2}{7} R_2 = \frac{1}{7} R_1 \right)$$
$$\left( \because R_3 = \frac{R_2}{2} = \frac{R_1}{4} \right)$$

Therefore if the values of the control signals (A3, A2, A1) are incremented from (0, 0, 0) to (1, 1, 1), then the signal output from the output terminal OUT is a waveform that rises linearly, and if they are decremented from (1, 1, 1) to (0, 0, 0), then the signal output from the output terminal OUT is a waveform that falls linearly. The slope of the waveform can be controlled according to the speed of the increment or the decrement. However, if such control is implemented using a digital control circuit, then if the period of the signal that is output from the output terminal OUT is T, then because the time required for the signal to rise or to fall is T/2, the digital control circuit must operate with a period of T/16, and this is difficult to achieve with a simple circuit.

Figure 12:
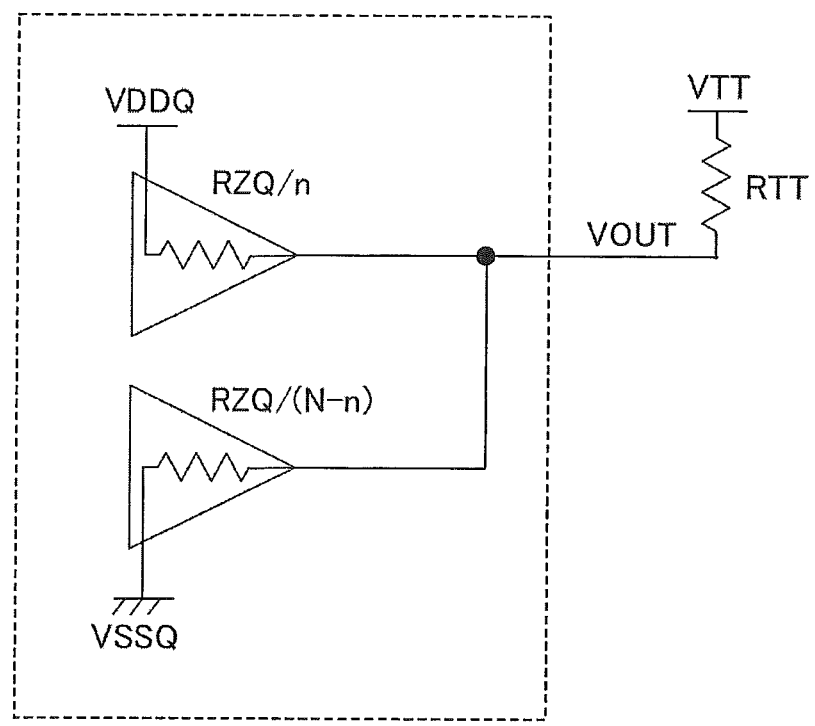
FIG. 12 is an equivalent circuit diagram of an output buffer.

In contrast, such a digital control circuit is unnecessary in this mode of embodiment, and waveforms that rise or fall in any time period can be obtained by appropriately designing the amount of delay in the unit delays. To describe this in more detail, incrementing one of the values of the control signals (A3, A2, A1) corresponds to switching one inverter having a resistance R1. Here, we assume that the inverter is a unit buffer having a resistance RZQ, and that N of these are connected in parallel between the high-potential power supply VDDQ and the low-potential power supply VSSQ. We assume a situation in which the output terminal is connected to a termination potential VTT via a termination resistor RTT, as illustrated in FIG. 12. If the output from each of the N unit buffers is 'Low', and if the output from n of these then switches to 'High', then as illustrated in FIG. 12, the high-potential-side resistance is RZQ/n, the low-potential-side resistance is RZQ/(N-n), and the output potential VOUT is as described by the following formula.

$$V_{OUT}(n) = \quad \text{[Formula 2]}$$
$$\frac{\frac{R_{ZQ}}{N-n} R_{TT} V_{DDQ} + R_{TT} \frac{R_{ZQ}}{n} V_{SSQ} + \frac{R_{ZQ}}{n} \frac{R_{ZQ}}{N-n} V_{TT}}{\frac{R_{ZQ}}{N-n} R_{TT} + R_{TT} \frac{R_{ZQ}}{n} + \frac{R_{ZQ}}{n} \frac{R_{ZQ}}{N-n}} =$$
$$\frac{(V_{DDQ} - V_{SSQ}) R_{TT}}{R_{ZQ} + N R_{TT}} n + \frac{R_{ZQ} V_{TT} + N R_{TT} V_{SSQ}}{R_{ZQ} + N R_{TT}}$$

Therefore the output potential VOUT is proportional to the number n of switched unit buffers, the following formula representing the case when n=0:

$$V_{OUT}(0) = \frac{(V_{DDQ} - V_{SSQ}) R_{TT}}{R_{ZQ} + N R_{TT}} \cdot 0 + \frac{R_{ZQ} V_{TT} + N R_{TT} V_{SSQ}}{R_{ZQ} + N R_{TT}} \quad \text{[Formula 3]}$$
$$= \frac{R_{ZQ} V_{TT} + N R_{TT} V_{SSQ}}{R_{ZQ} + N R_{TT}}$$

Further, if n=N, the formula becomes:

$$V_{OUT}(N) = \frac{(V_{DDQ} - V_{SSQ}) R_{TT}}{R_{ZQ} + N R_{TT}} N + \frac{R_{ZQ} V_{TT} + N R_{TT} V_{SSQ}}{R_{ZQ} + N R_{TT}} \quad \text{[Formula 4]}$$
$$= \frac{R_{ZQ} V_{TT} + N R_{TT} V_{DDQ}}{R_{ZQ} + N R_{TT}}$$

Thus the output potential VOUT is proportional to the number n of switched unit buffers. Therefore if the amount of delay for each unit delay 1 is td, the operation of the unit buffers switches successively, and the slope SR of the obtained output signal waveform is as per the following formula:

$$SR = \frac{(V_{DDQ} - V_{SSQ}) R_{TT} / (R_{ZQ} + N R_{TT})}{t_d} \quad \text{[Formula 5]}$$

Therefore any slope SR can be obtained in accordance with the amount of delay td of the unit delays. Further, the output resistance is RZQ/n, which is fixed for any value of n, and therefore the output resistance during the output transition period is also fixed. It should be noted that the output waveform is not stepped, but is designed to be a smooth waveform.

Further, the method of switching the operation of the unit buffers successively is in principle effective for reducing noise even if the amount of delay td of the unit delays is very small. For example, if an output buffer generating a drive current waveform a(t) comprises n unit buffers, then if the time for switching the operation of a unit buffer is fixed at Δt, the current waveform g(t) is represented by the following formula. Here, u(t) is a unit step function.

$$g(t) = \quad \text{[Formula 6]}$$
$$\frac{a(t)u(t) + a(t - \Delta t)u(t - \Delta t) + a(t - 2\Delta t)u(t - 2\Delta t) + \ldots + a(t - (n-1)\Delta t)u(t - (n-1)\Delta t)}{n}$$

If we let the Fourier transform of a(t) be A(f), then the Fourier transform G(f) of g(t) is represented by the following formula.

$$\begin{cases} G(f) = A(f) P(f) \\ P(f) = \frac{1 + e^{-j2\pi f \Delta t} + e^{-j2\pi f 2\Delta t} + \ldots e^{-j2\pi f (n-1)\Delta t}}{n} \end{cases} \quad \text{[Formula 7]}$$

Figure 39:
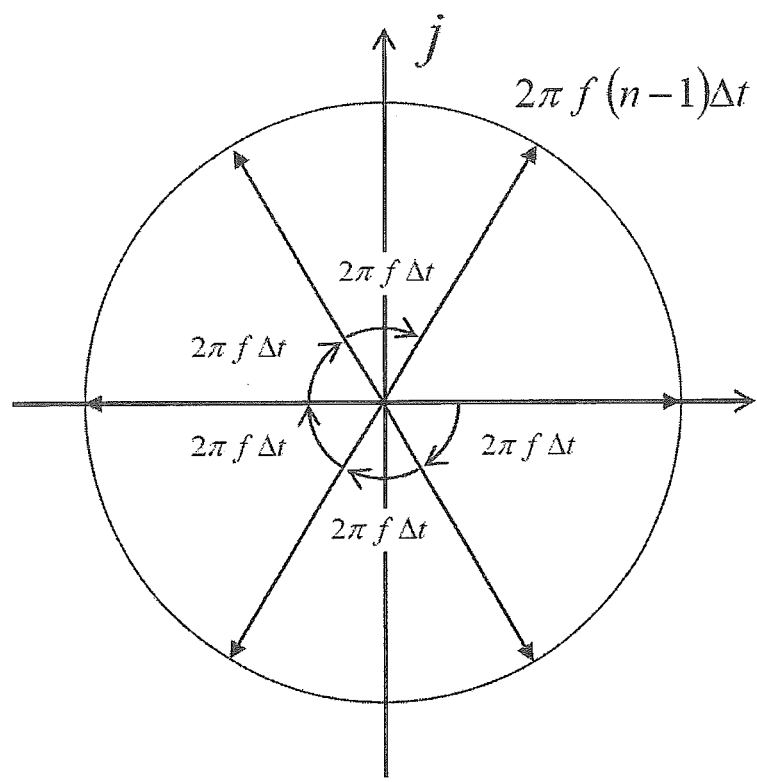
FIG. 39 is a drawing used to explain the principle by which the effect of the present invention is obtained.

In other words, the Fourier transform G(f) of the current waveform g(t) generated when the unit buffers are switched successively is generated using a Fourier transform P(f) of a phase shift component to filter the Fourier transform A(f) of the current waveform a(t) for a case in which the unit buffers are switched at the same time. P(f) is proportional to the sum of complex space unit vectors such as those illustrated in FIG. 39, and therefore its magnitude varies periodically, the magnitude cycling once and returning to 1 with the following frequency.

$$2\pi f \Delta t = 2\pi k, k = 0, 1, 2, \ldots \quad \text{[Formula 8]}$$

$$f = \frac{k}{\Delta t}, k = 0, 1, 2, \ldots$$

Figure 40:
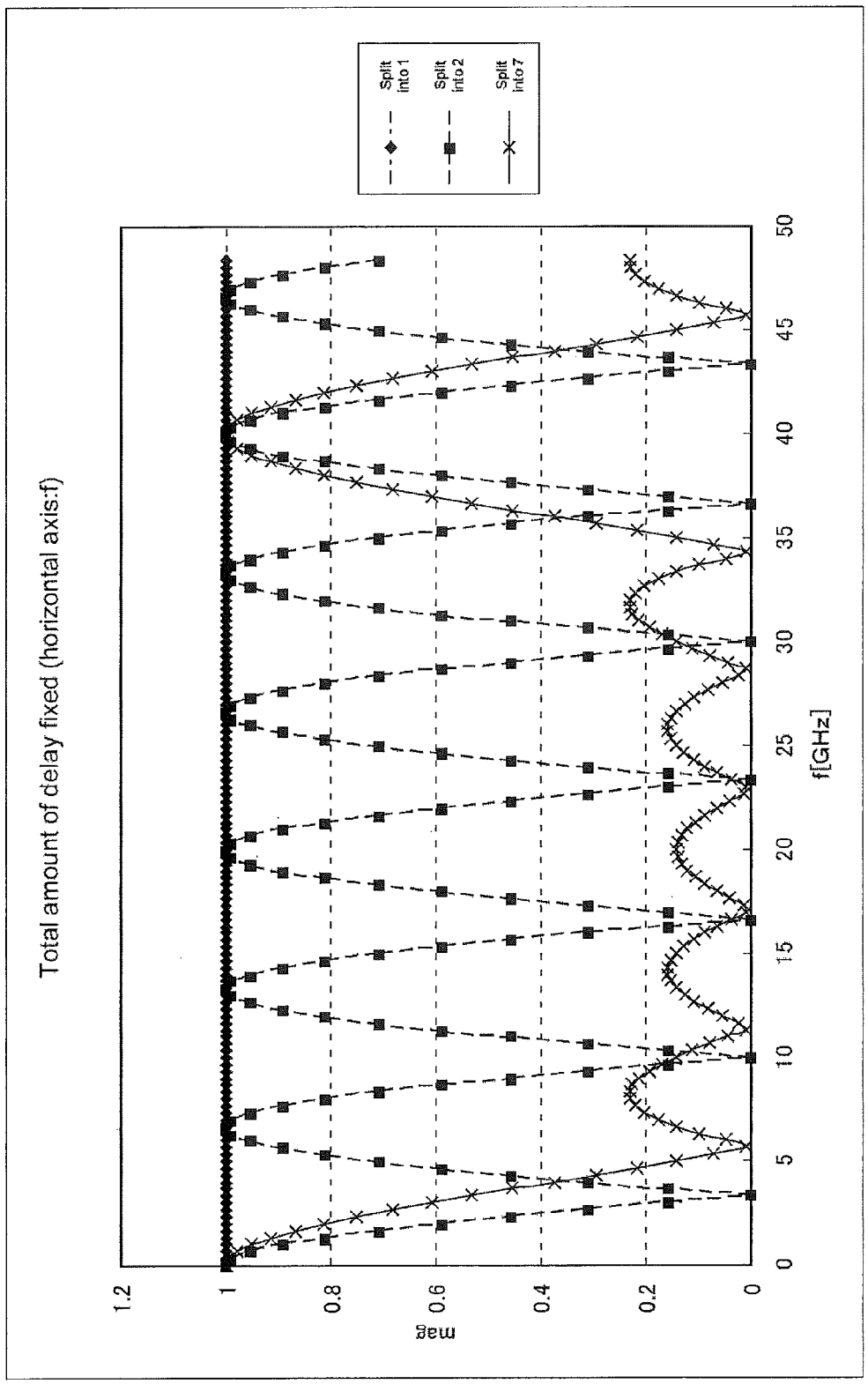
FIG. 40 is a drawing illustrating spectra for cases in which an output buffer is split into 1, split into 2, and split into 7 using unit buffers.
Figure 41:
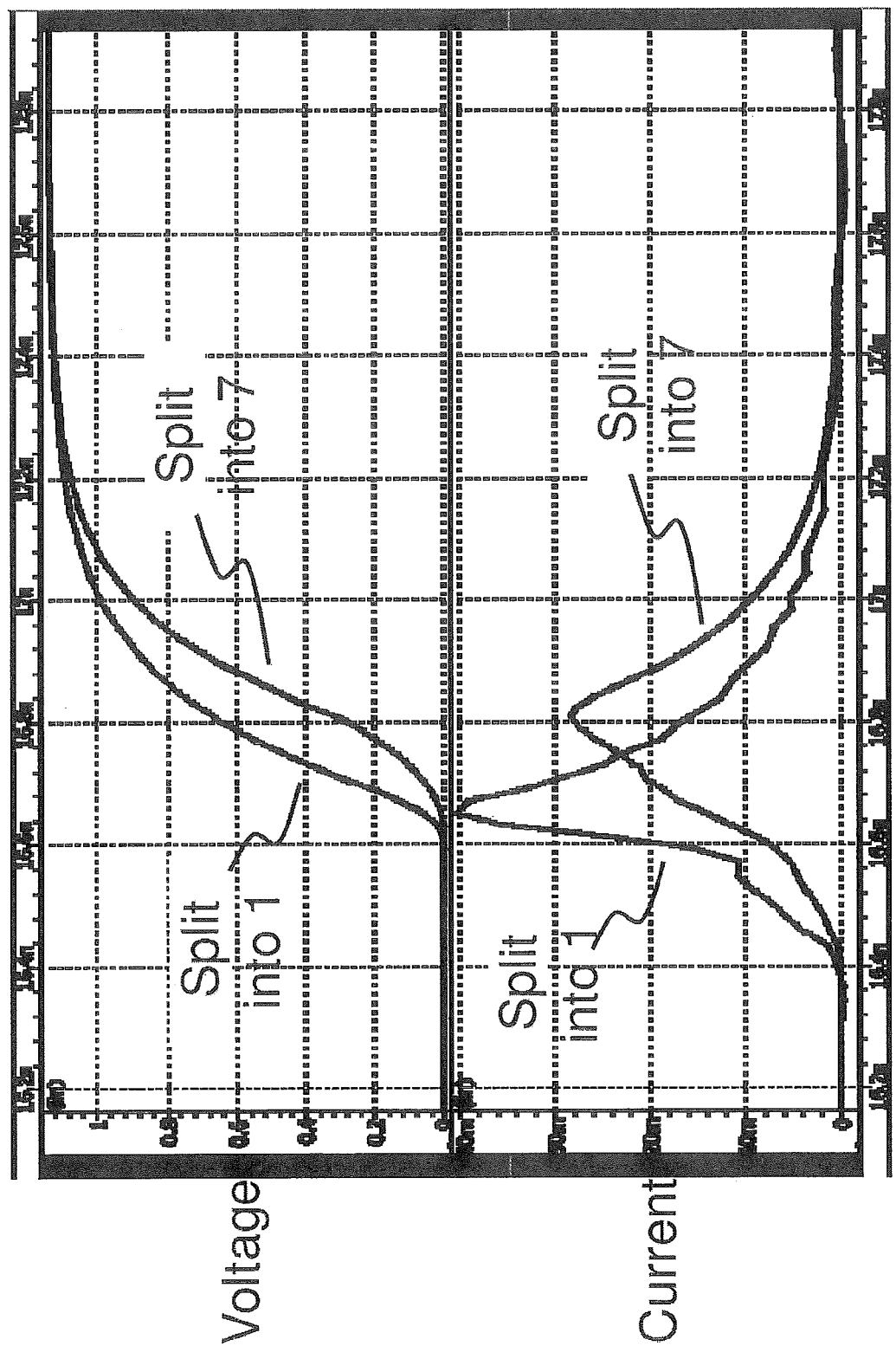
FIG. 41 is a graph illustrating a voltage waveform and a current waveform for cases in which an output buffer is split into 1 and split into 7 using unit buffers.

During one cycle, P(f) becomes smaller, blocking the spectrum in this frequency range. The situation when the output buffer is split into 1, split into 2, and split into 7 using unit buffers is illustrated in FIG. 40. In FIG. 40, Δt=tTOT for the case in which the output buffer has been split into 2, and Δt=tTOT/6 for the case in which it has been split into 7, so that the total time taken to switch the unit buffers (the total amount of delay) is fixed. For the case in which the output buffer is split into 1, Δt=∞. Setting the total amount of delay to be equal means that the slope of the waveform is approximately the same, but as illustrated in FIG. 40, even though the total amount of delay is fixed, blocked frequency regions are manifested more clearly when the output buffer is multi-split, and high-frequency components can be cut over a wide range. High-frequency current components generate an inductive counter-electromotive force, causing noise, but this can be suppressed. FIG. 41 illustrates the voltage waveform and the current waveform for cases in which the output buffer is split into 1 and split into 7. Cutting the high-frequency components corresponds to smoothing out the sections of the voltage and current waveforms during operation startup. Thus even if the current dispersion does not cover the entire transition period, multi-split operation has, in principle, the characteristic of suppressing noise. It goes without saying that the delay is designed to achieve a smooth waveform.

As described hereinabove, according to this mode of embodiment the peak consumed current can be suppressed by successively switching the operation of the unit buffers 101 to 107 using the plurality of unit delays 122 to 127.

Figure 13:
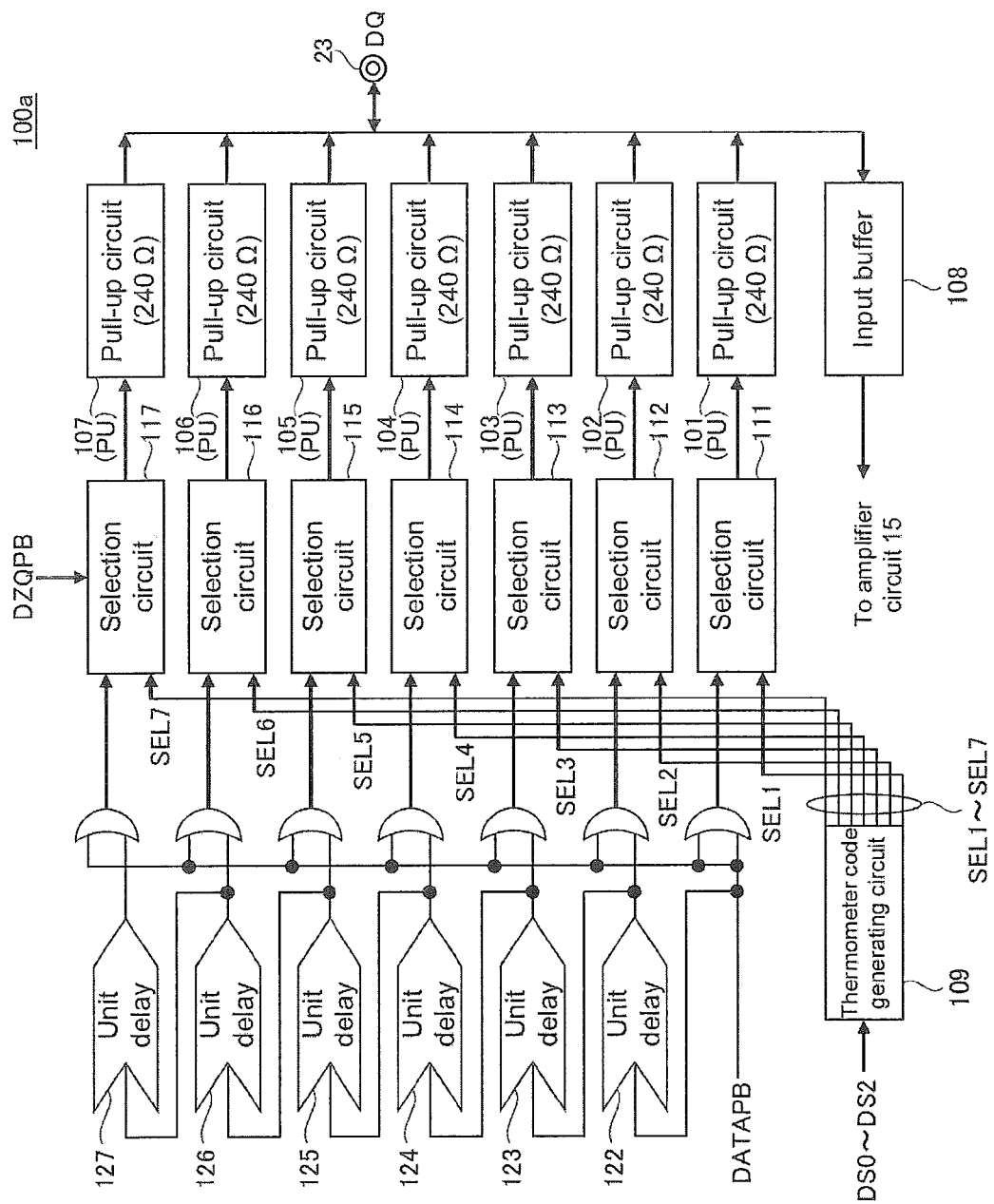
FIG. 13 is a circuit diagram of a data input and output circuit 100a according to a modified example of the first mode of embodiment.

FIG. 13 is a circuit diagram of a data input and output circuit 100*a* according to a modified example of the first mode of embodiment. FIG. 13 illustrates only the pull-up circuits PU and circuit parts related thereto.

In the data input and output circuit 100*a* illustrated in FIG. 13, OR gate circuits are provided in front of the selection circuits 111 to 117. The internal data DATAPB and the output signal from the corresponding unit delay 122 to 127 are input into each OR gate circuit. Although not shown in the drawing, AND gate circuits are provided in front of the selection circuits 111 to 117 in the parts of the circuit relating to the pull-down circuits PD.

By means of this configuration, if the internal data DATAPB is in the high-level state, all the pull-up circuits PU contained in the unit buffers 101 to 107 are forced into the OFF state. It is thus possible to reduce the current that flows when the logic level of the read data DQ transitions. However, when the logic level of the read data DQ transitions from the high-level state to the low-level state, all the pull-up circuits PU move simultaneously to the OFF state, and it is therefore not possible to control the slope of the output waveform by switching the number of activated pull-up circuits PU and the number of activated pull-down circuits PD in stages, or to prevent a complex reflection by fixing the output resistance during the transition.

In the data input and output circuit 100 (100*a*) according to the first mode of embodiment described hereinabove, the operational timing of the unit buffers 101 to 107 is fixed, and therefore the transition time period for the read data DQ is determined in proportion to the number of activated unit buffers 101 to 107 (in other words the selected output impedance). A second mode of embodiment which resolves such problems will now be described.

In the second mode of embodiment, the delay time td of the unit delays is considered to be td(N), which is variable in accordance with the number N arranged in parallel, and this has the proportional relationship shown in the following formula. The transition time period of the read data DQ can thus be fixed or substantially fixed, with no dependency on the output impedance.

$$t_d(N) \propto \frac{1}{N-1}, \text{ where, } N \geq 2 \quad \text{[Formula 9]}$$

Figure 14:
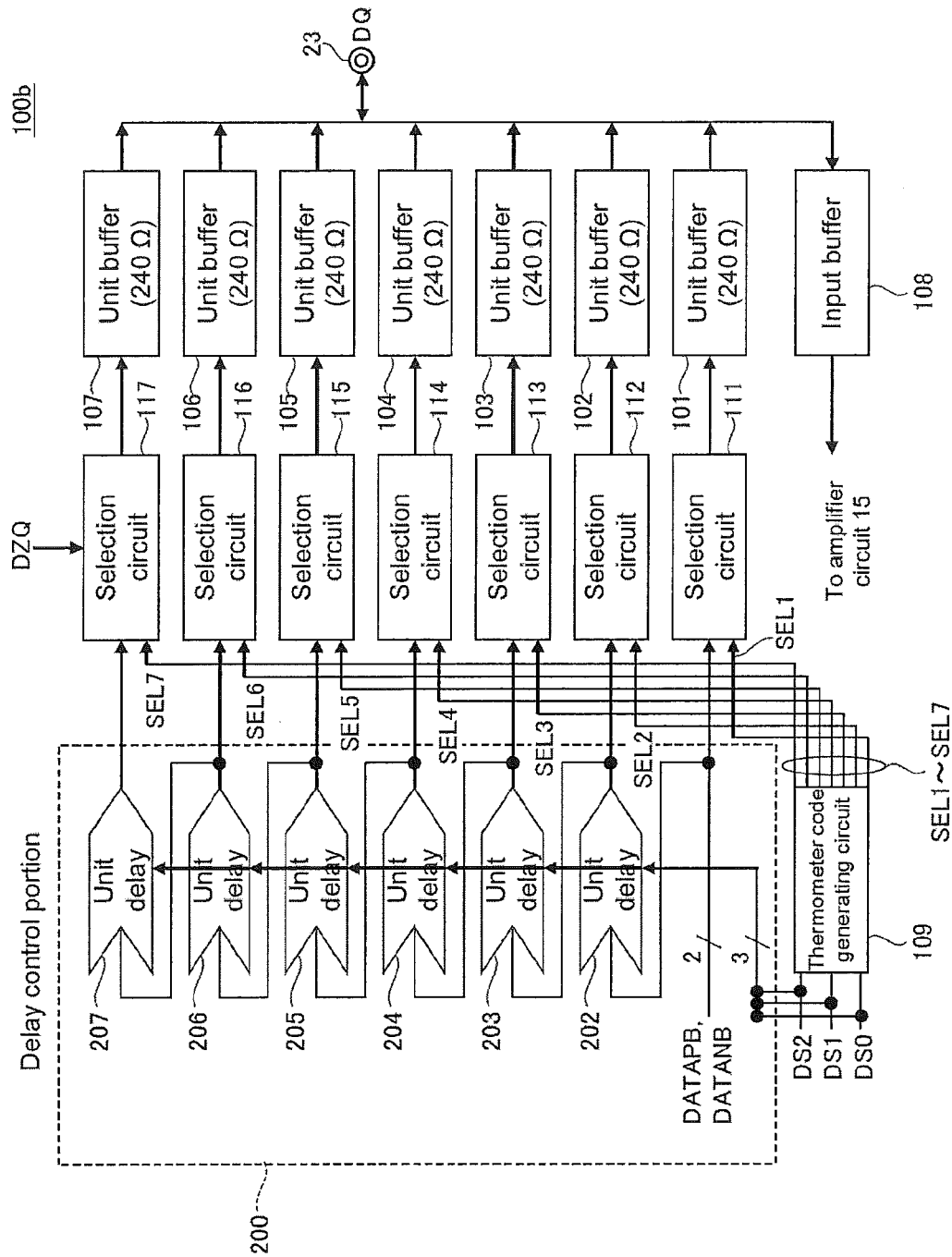
FIG. 14 is a circuit diagram of a data input and output circuit 100b according to a second mode of embodiment of the present invention.

FIG. 14 is a circuit diagram of a data input and output circuit 100*b* according to the second mode of embodiment of the present invention.

In the data input and output circuit 100*b* according to this mode of embodiment, the configuration of a delay control portion 200, which contains a plurality of unit delays, differs from the data input and output circuit 100 according to the first mode of embodiment. Other points are the same as for the data input and output circuit 100 according to the first mode of embodiment, and therefore the same reference codes are appended to the same elements, and duplicate descriptions are omitted. As illustrated in FIG. 14, in this mode of embodiment the mode signals DS0 to DS2 are also supplied to the delay control portion 200.

Figure 15:
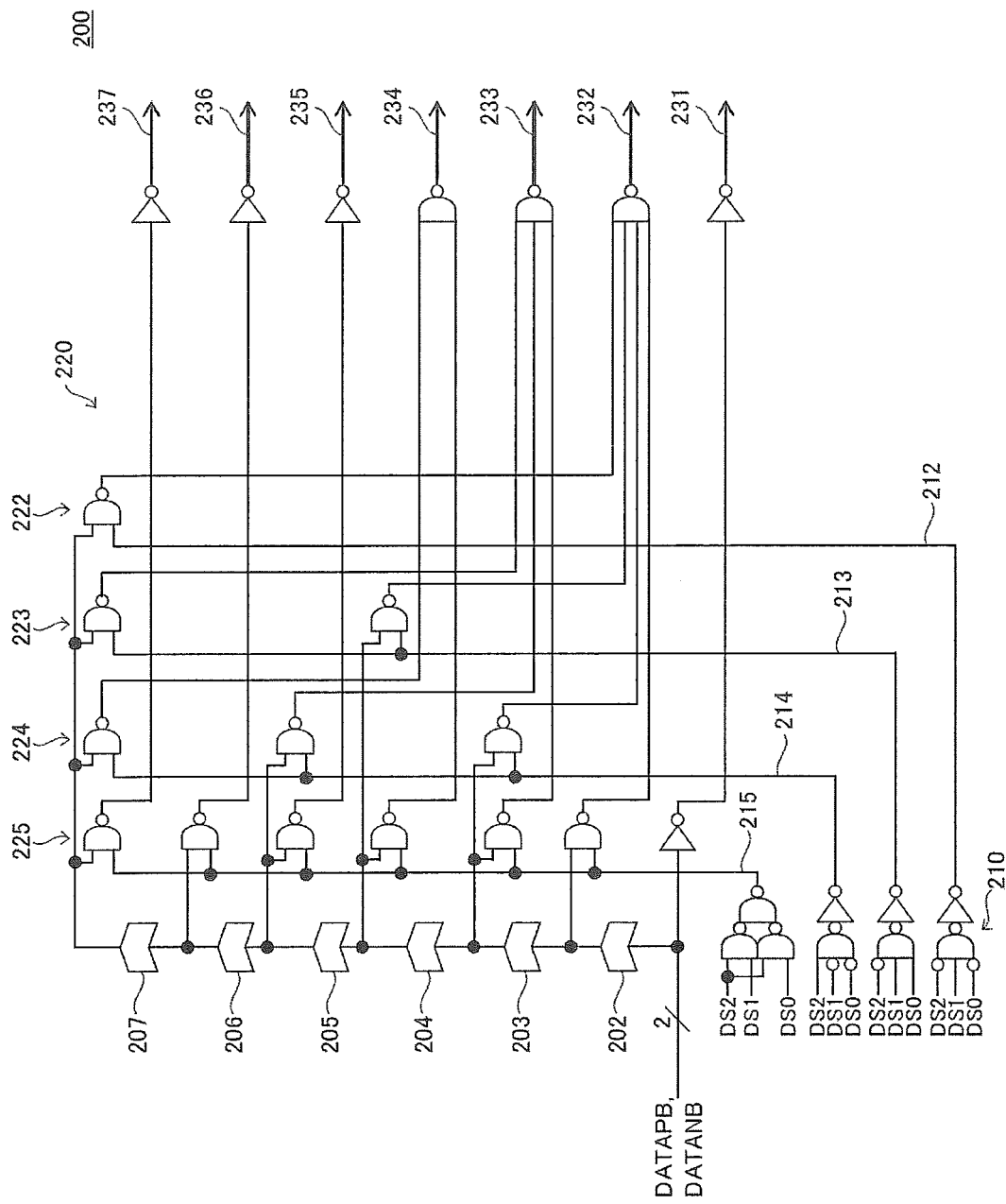
FIG. 15 is a circuit diagram of a delay control portion 200.

FIG. 15 is a circuit diagram of the delay control portion 200.

As illustrated in FIG. 15, the delay control portion 200 comprises unit delays 202 to 207, a decoder 210 and a logic gate circuit 220. The unit delays 202 to 207 comprise circuits corresponding respectively to the unit delays 122 to 127 illustrated in FIG. 3, and each has the same amount of delay.

The decoder 210 is a circuit which decodes the mode signals DS0 to DS2, and it activates either one of decoding signals 212 to 215 in accordance with the values of the mode signals DS0 to DS2. To describe this more specifically, the decoding signal 212 is activated if the values of the mode signals DS0 to DS2 are values selecting the thermometer codes SEL1 and SEL2. The decoding signal 213 is activated if the values of the mode signals DS0 to DS2 are values selecting the thermometer codes SEL1 to SEL3. The decoding signal 214 is activated if the values of the mode signals DS0 to DS2 are values selecting the thermometer codes SEL1 to SEL4. The decoding signal 215 is activated if the values of the mode signals DS0 to DS2 are values selecting the thermometer codes SEL1 to SEL5, SEL1 to SEL6 or SEL1 to SEL7.

The decoding signals 212 to 215 respectively select circuits 222 to 225 contained in the logic gate circuit 220, and only the output signals from the selected circuit 222 to 225 are activated. By means of this configuration, the timing at which internal data 231 to 237 change after the internal data DATAPB and DATANB have changed varies in accordance with the mode signals DS0 to DS2. It should be noted that the internal data 231 to 237 are internal data supplied respectively to the selection circuits 111 to 117.

FIG. 16 is a table used to describe the relationship between the number of unit buffers 101 to 107 to be activated and the timing with which the operation thereof is switched. The numbers shown in the grid in the table in FIG. 16 represent the number of passes through the unit delays, larger numbers signifying a greater delay in the timing with which the operation is switched.

First, if the two unit buffers 101 and 102 are to be activated (if the output impedance is 120Ω), then the decoding signal 212 is selected in the delay control portion 200, and therefore the circuit 222 is selected. As a result, the internal data 232 corresponding to the unit buffer 102 is changed after the internal data DATAPB and DATANB have passed through all six unit delays 202 to 207. In FIG. 16, the '6' displayed in the cell at the intersection of the row in which the number activated is 2 and the column of the unit buffer 102, signifies that the unit buffer 102 is activated after the internal data have passed though six unit delays. It should be noted that the internal data 231 corresponding to the unit buffer 101 changes immediately in response to the internal data DATAPB and DATANB, irrespective of the values of the mode signals DS0 to DS2. '0' is thus displayed in FIG. 16. Therefore, if the amount of delay of each unit delay is td, then the operation of the unit buffer 102 switches after 6×td has elapsed after the operation of the unit buffer 101 has been switched.

Further, if the three unit buffers 101 to 103 are to be activated (if the output impedance is 80Ω), then the decoding signal 213 is selected in the delay control portion 200, and therefore the circuit 223 is selected. As a result, the internal data 232 corresponding to the unit buffer 102 is changed after the internal data DATAPB and DATANB have passed through the three unit delays 202 to 204, and the internal data 233 corresponding to the unit buffer 103 is changed after the internal data DATAPB and DATANB have passed through all six unit delays 202 to 207. Therefore, the operation of the unit buffer 102 switches after 3×td has elapsed after the operation of the unit buffer 101 has been switched, and the operation of the unit buffer 103 switches after 6×td has elapsed after the operation of the unit buffer 101 has been switched.

The operation for situations in which four or more of the unit buffers 101 to 107 are to be activated is as shown in FIG. 16, from which it can be seen that the intervals at which the operation of the unit buffers 101 to 107 are switched decrease as the number of unit buffers 101 to 107 to be activated increases. By means of such control, the transition time period of the read data DQ can thus be substantially fixed, with no dependency on the output impedance.

It should be noted that, as illustrated in FIG. 16, if the five unit buffers 101 to 105 are to be activated, or if the six unit buffers 101 to 106 are to be activated, the transition time period of the read data DQ is slightly reduced, but the circuit configuration of the logic gate circuits 220 may also be modified such that the transition time period of the read data DQ is also the same in these cases. However, in this case the intervals at which the operation of the unit buffers 101 to 107 is switched will not be uniform. It would be possible to arrange that the transition time period of the read data DQ is fixed, and that the intervals at which the operation of the unit buffers 101 to 107 is switched are uniform, but this would require a larger number of unit delays, and the circuit configuration of the logic gate circuit 220 would be significantly more complicated. The configuration to be adopted should therefore be selected appropriately in accordance with the desired characteristics.

Thus, with the data input and output circuit 100*b* according to this mode of embodiment, the transition time period of the read data DO can be substantially fixed, with no dependency on the output impedance.

Figure 17:
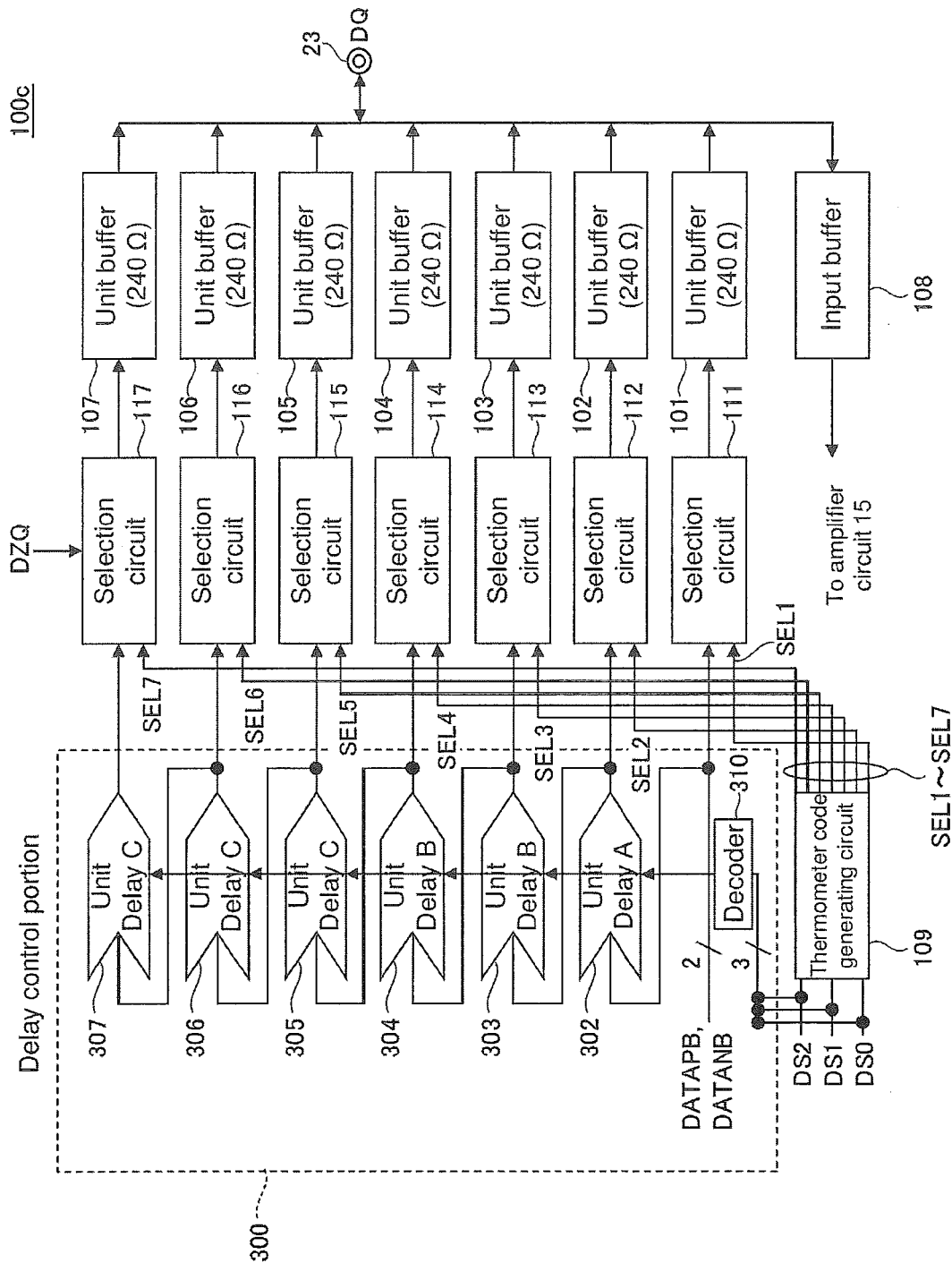
FIG. 17 is a circuit diagram of a data input and output circuit 100c according to a first modified example of the second mode of embodiment.

FIG. 17 is a circuit diagram of a data input and output circuit 100*c* according to a first modified example of this mode of embodiment.

Figure 18:
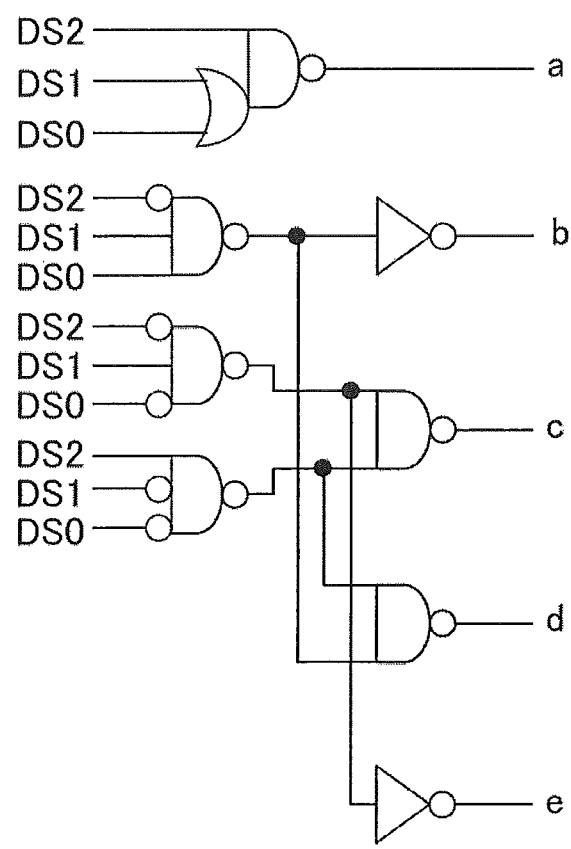
FIG. 18 is a circuit diagram of a decoder 310.

The data input and output circuit 100*c* illustrated in FIG. 17 differs from the data input and output circuit 100*b* illustrated in FIG. 14 in that a delay control portion 300 is used instead of the delay control portion 200. Other points are the same as for the data input and output circuit 100*b* illustrated in FIG. 14, and therefore the same reference codes are appended to the same elements, and duplicate descriptions are omitted. As illustrated in FIG. 17, the delay control portion 300 contains unit delays 302 to 307 and a decoder 310. The decoder 310 has the circuit configuration illustrated in FIG. 18, and it activates one or more decoding signals a to e in accordance with the values of the mode signals DS0 to DS2. The relationship between the number of unit buffers 101 to 107 to be activated and the decoding signals a to e to be activated is as illustrated in FIG. 19. In FIG. 19, the decoding signals to be activated are indicated using a circle (○).

Figure 20:
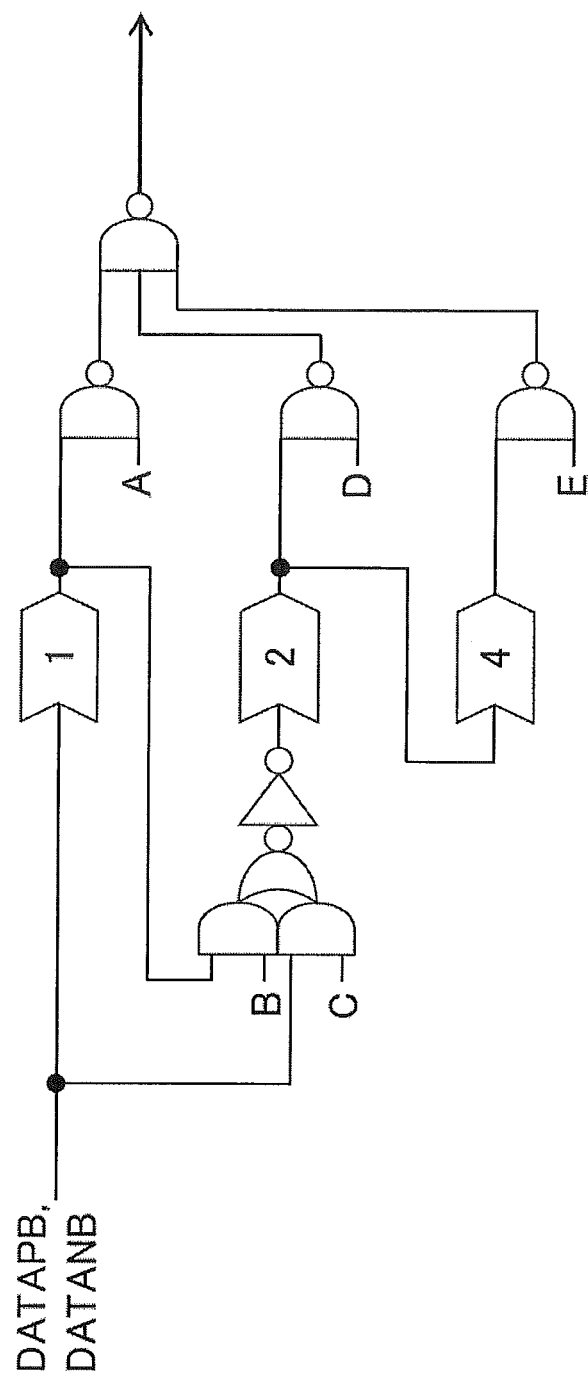
FIG. 20 is a circuit diagram of a unit delay A.
Figure 21:
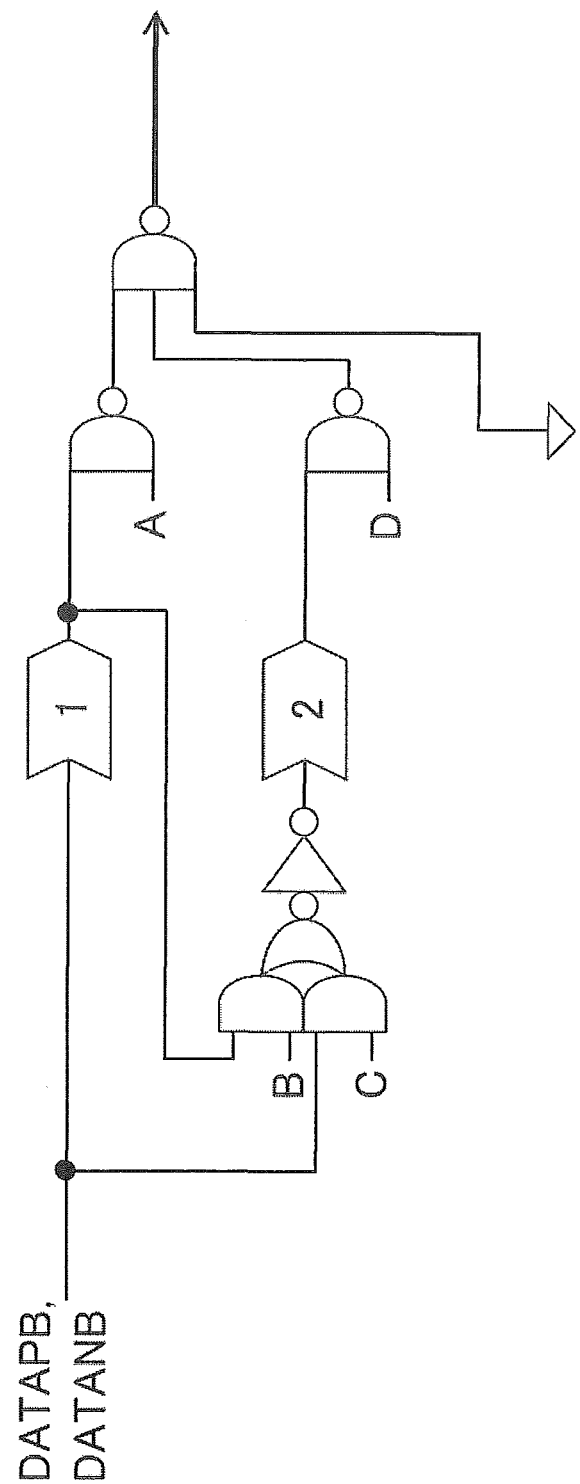
FIG. 21 is a circuit diagram of a unit delay B.
Figure 22:
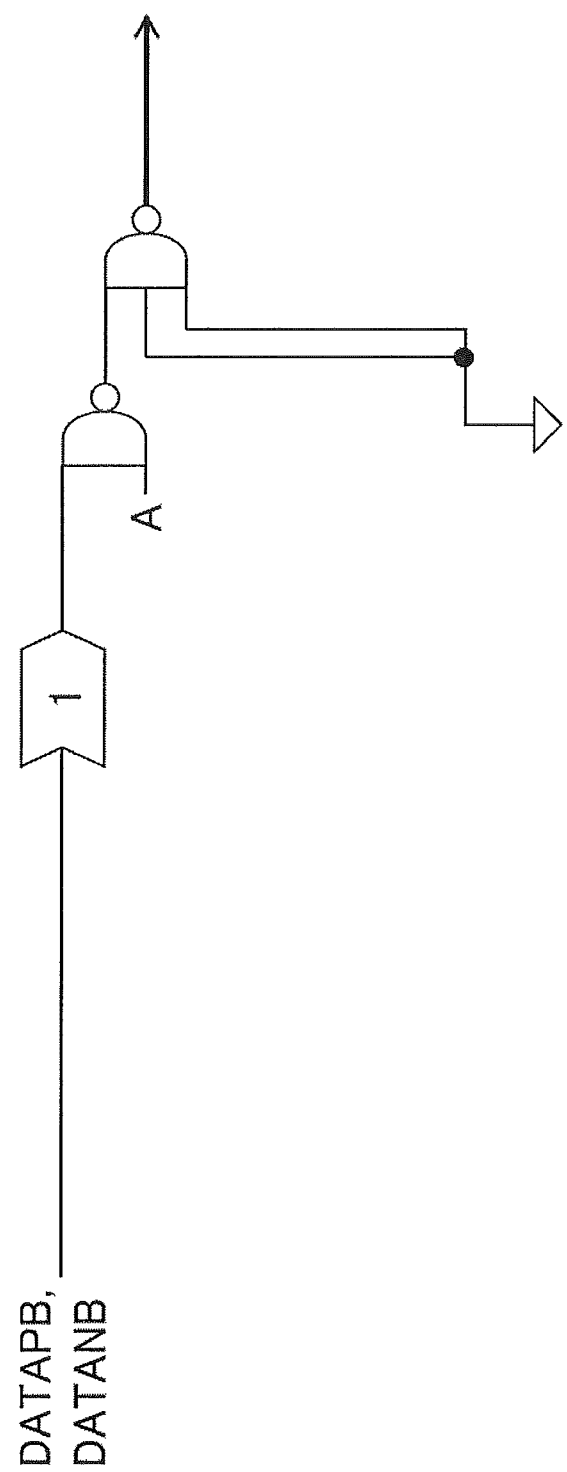
FIG. 22 is a circuit diagram of a unit delay C.

The unit delays 302 to 307 comprise one of three types of unit delay A, B and C. As illustrated in FIG. 17, the unit delay 302 comprises a unit delay A, the unit delays 303 and 304 comprise unit delays B, and the unit delays 305 to 307 comprise unit delays C. The circuit configurations of the unit delays A, B and C are illustrated respectively in FIG. 20, FIG. 21 and FIG. 22.

By means of such a configuration, the amount of delay in the unit delays A, B and C is as illustrated in FIG. 19, and as a result the relationship between the unit buffers 101 to 107 to be activated, and the timing with which their operation is switched, is the same as the relationship illustrated in FIG. 16, as illustrated in FIG. 19. Therefore the data input and output circuit 100*c* illustrated in FIG. 17 can perform the same operations as the data input and output circuit 100*b* illustrated in FIG. 14.

Figure 23:
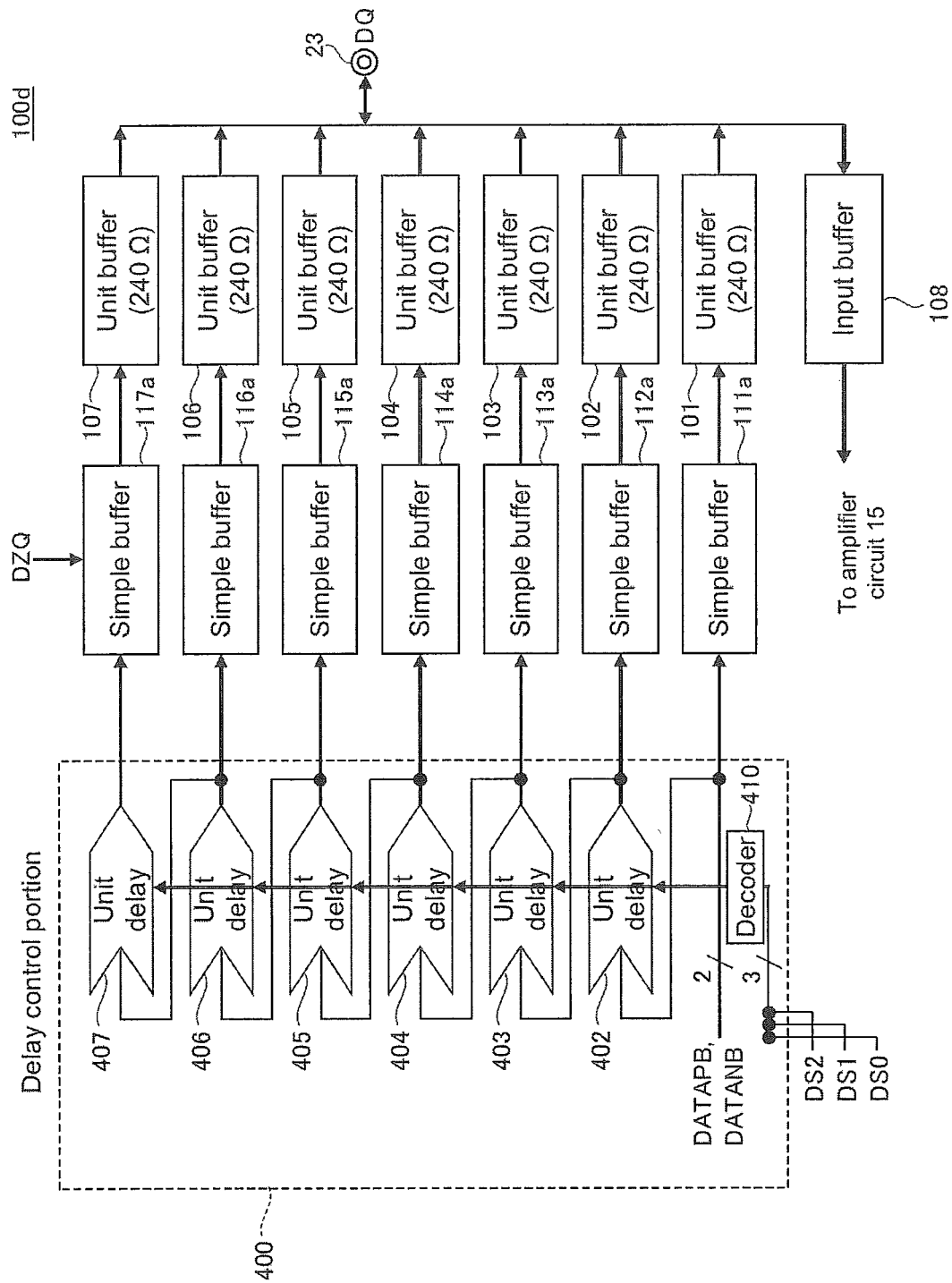
FIG. 23 is a circuit diagram of a data input and output circuit 100d according to a second modified example of the second mode of embodiment.

FIG. 23 is a circuit diagram of a data input and output circuit 100*d* according to a second modified example of this mode of embodiment.

The data input and output circuit 100*d* illustrated in FIG. 23 differs from the data input and output circuit 100*b* illustrated in FIG. 14 in that the thermometer code generating circuit 109 is omitted, its function being provided by a delay control portion 400. In relation to this, the selection circuits 111 to 117 are replaced with simple buffers 111*a* to 117*a*. The simple buffers 111*a* to 117*a* have a configuration in which the logic gate circuit 150 is omitted from the selection circuits 111 to 117 illustrated in FIG. 6. Other points are the same as for the data input and output circuit 100*b* illustrated in FIG. 14, and therefore the same reference codes are appended to the same elements, and duplicate descriptions are omitted.

Figure 24:
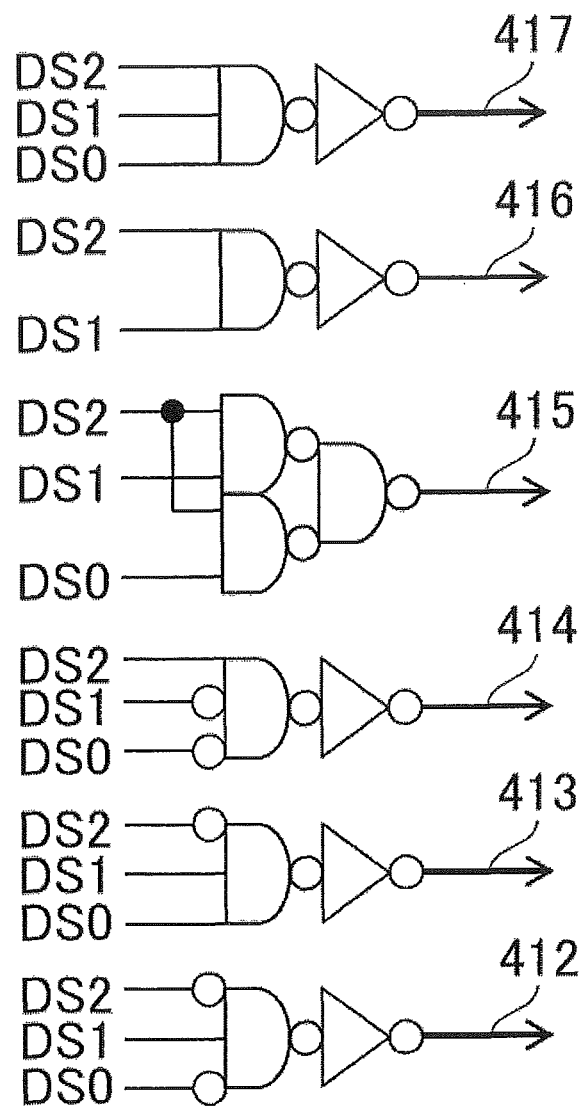
FIG. 24 is a circuit diagram of a decoder 410.

FIG. 24 is a circuit diagram of the decoder 410 contained in the delay control portion 400. The decoder 410 is a circuit which decodes the mode signals DS0 to DS2, and it activates one or more of decoding signals 412 to 417 in accordance with the values of the mode signals DS0 to DS2. The relationship between the values of the mode signals DS0 to DS2, in other words the number of unit buffers 101 to 107 to be activated, and the decoding signals 412 to 417 to be activated is as illustrated in FIG. 25. In FIG. 25, the decoding signals to be activated are indicated using a circle (○)

Figure 26:
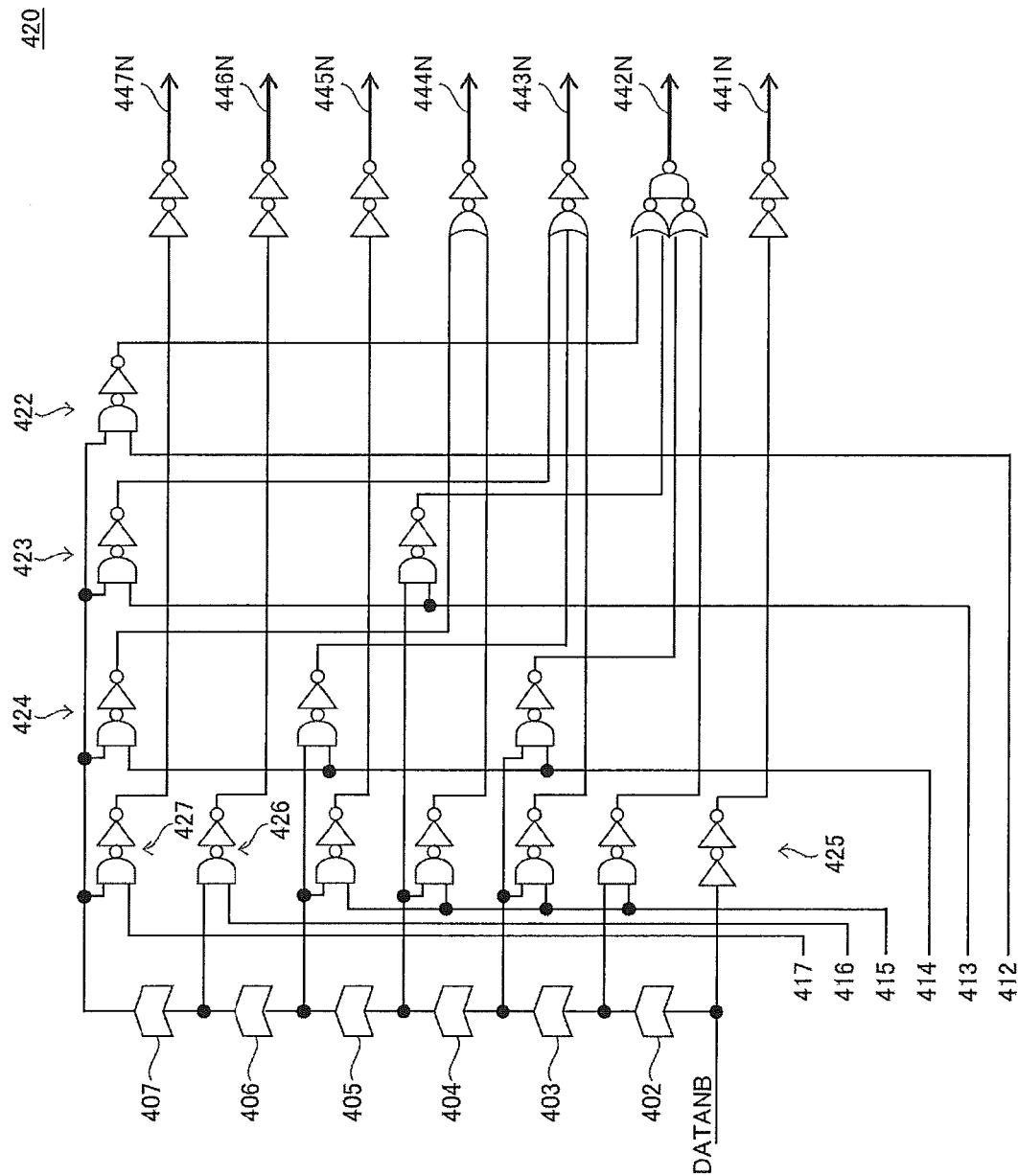
FIG. 26 is a circuit diagram of a logic gate circuit 420.
Figure 27:
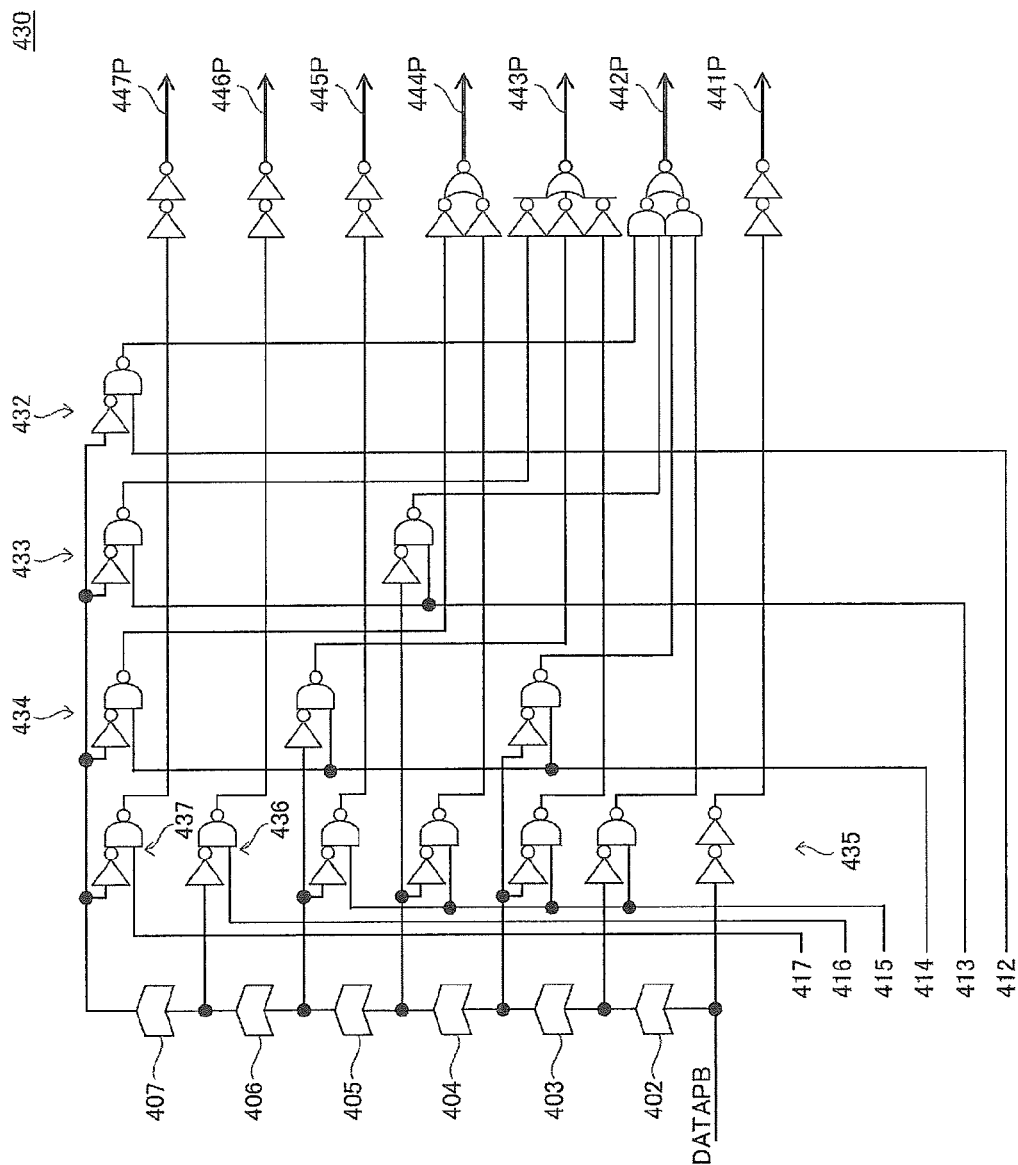
FIG. 27 is a circuit diagram of a logic gate circuit 430.

FIG. 26 and FIG. 27 illustrate respectively a logic gate circuit 420 which handles the internal data DATANB, and a logic gate circuit 430 which handles the internal data DATAPB, these being circuits contained in the delay control portion 400. FIG. 26 and FIG. 27 each include unit delays 402 to 407.

As illustrated in FIG. 26 and FIG. 27, the logic gate circuits 420 and 430 both have circuit configurations that are similar to that of the logic gate circuit 220 illustrated in FIG. 15. More specifically, circuits 422 to 427 contained in the logic gate circuit 420, and circuits 432 to 437 contained in the logic gate circuit 430, are selected respectively by the decoding signals 412 to 417, and only the output signals from the selected circuits 422 to 427 and 432 to 437 are activated. By means of this configuration, the timing at which internal data 441N to 447N and 441P to 447P change after the internal data DATAPB and DATANB have changed varies in accordance with the mode signals DS0 to DS2. It should be noted that the internal data 441N to 447N and 441P to 447P are internal data supplied respectively to the simple buffers 111a to 117a.

By means of such a configuration, the relationship between the unit buffers 101 to 107 to be activated, and the timing with which they are activated, is the same as the relationship illustrated in FIG. 16, as illustrated in FIG. 25. Therefore the data input and output circuit 100d illustrated in FIG. 23 can perform the same operations as the data input and output circuit 100b illustrated in FIG. 14.

Figure 28:
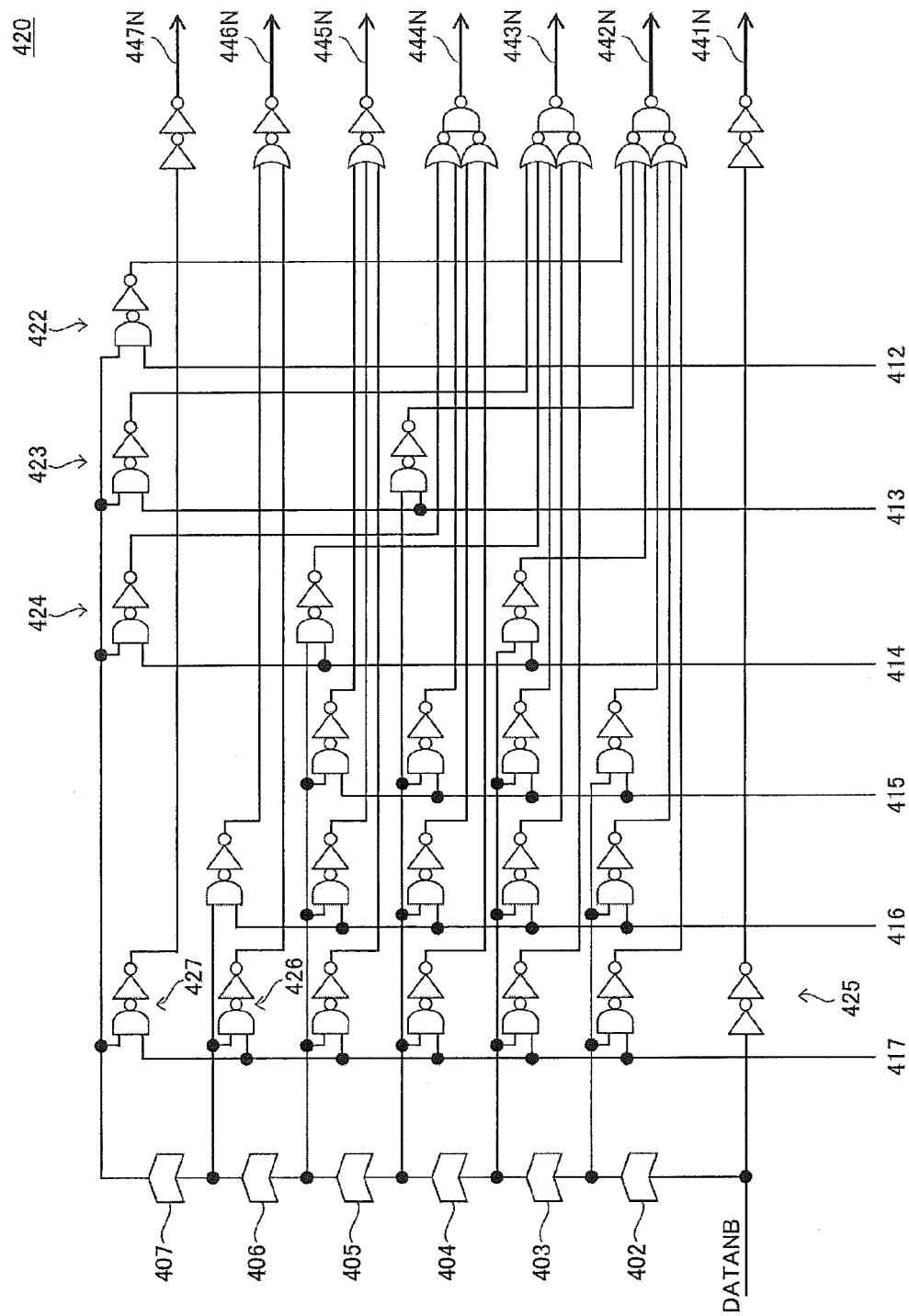
FIG. 28 is a circuit diagram of a logic gate circuit 420 according to a modified example.

It should be noted that the same circuit as for the decoder 130 illustrated in FIG. 4 can be used for the decoder 410. In this case, the circuit configuration of the logic gate circuit 420 should be modified to the circuit configuration illustrated in FIG. 28. The logic gate circuit 430 should also be modified to a similar circuit configuration, although this is not shown in the drawings.

Figure 29:
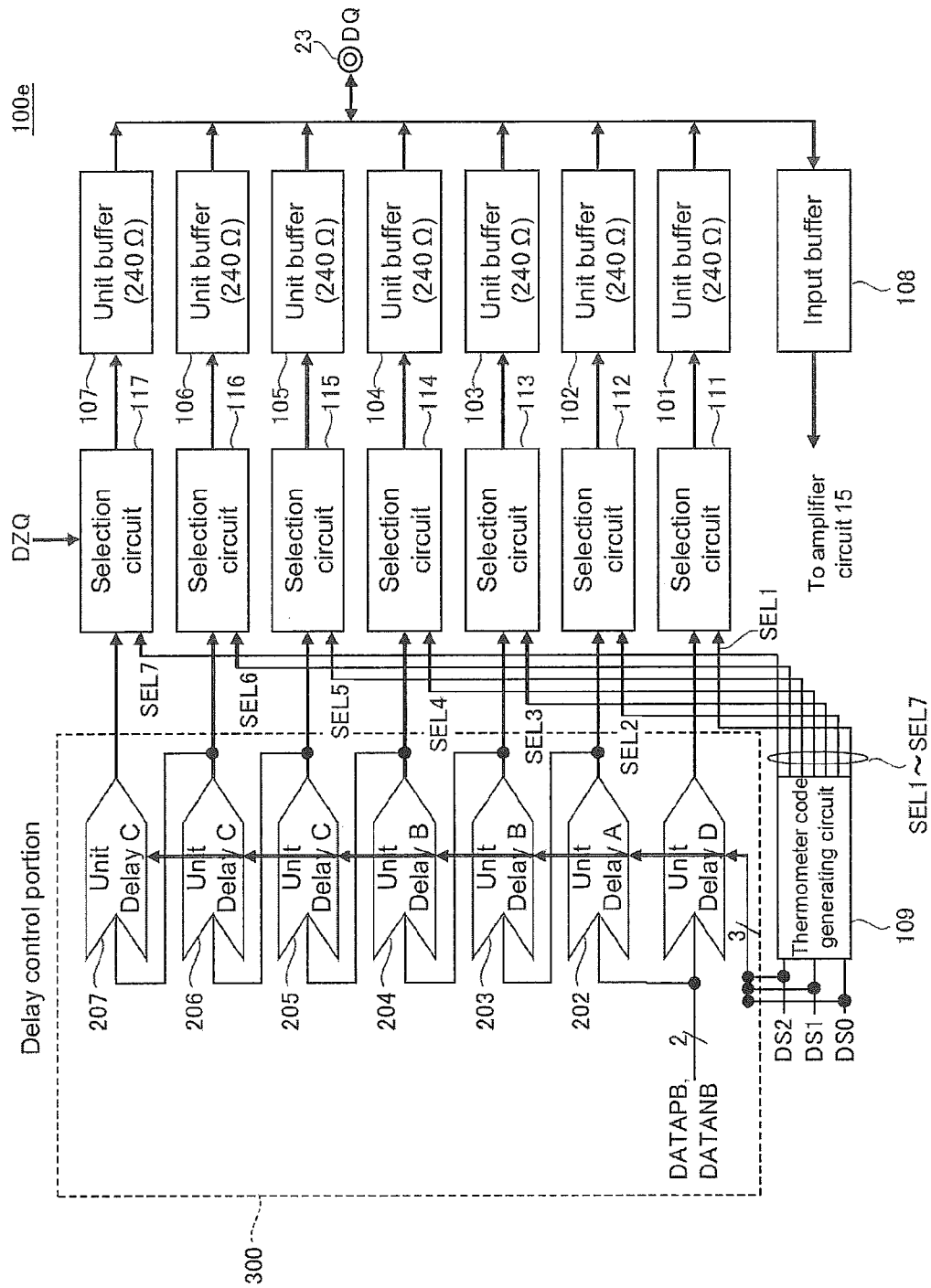
FIG. 29 is a circuit diagram of a data input and output circuit 100e according to a third modified example of the second mode of embodiment.

FIG. 29 is a circuit diagram of a data input and output circuit 100e according to a third modified example of this mode of embodiment.

The data input and output circuit 100e illustrated in FIG. 29 differs from the data input and output circuit 100c illustrated in FIG. 17 in that a unit delay 201 (unit delay D) has been added to the delay control portion 300. Other points are the same as for the data input and output circuit 100c illustrated in FIG. 17, and therefore the same reference codes are appended to the same elements, and duplicate descriptions are omitted.

The unit delay 201 is a circuit used when the values of the mode signals DS0 to DS2 are the minimum values, in other words when only the unit buffer 101 is to be activated, and it is bypassed if two or more unit buffers 101 to 107 are to be activated. By employing such a unit delay 201, the operational timing for a case in which only the unit buffer 101 is to be activated can be made to coincide substantially with the operational timing for a case in which two or more of the unit buffers 101 to 107 are to be activated.

In the data input and output circuits 100 to 100e according to the first and second modes of embodiment described hereinabove, unit delays 102 to 107 or 202 to 207 are connected in cascade to corresponding unit buffers 102 to 107 respectively, and therefore the minimum interval at which the operation of the unit buffers 101 to 107 is switched is restricted to the amount of delay in one unit delay. Normally, a unit delay comprises an even number of inverter circuits, and therefore if the required amount of delay is less than the amount of delay in two inverter circuits, this delay cannot be achieved using the first or second modes of embodiment. A third mode of embodiment which resolves such problems will now be described.

Figure 30:
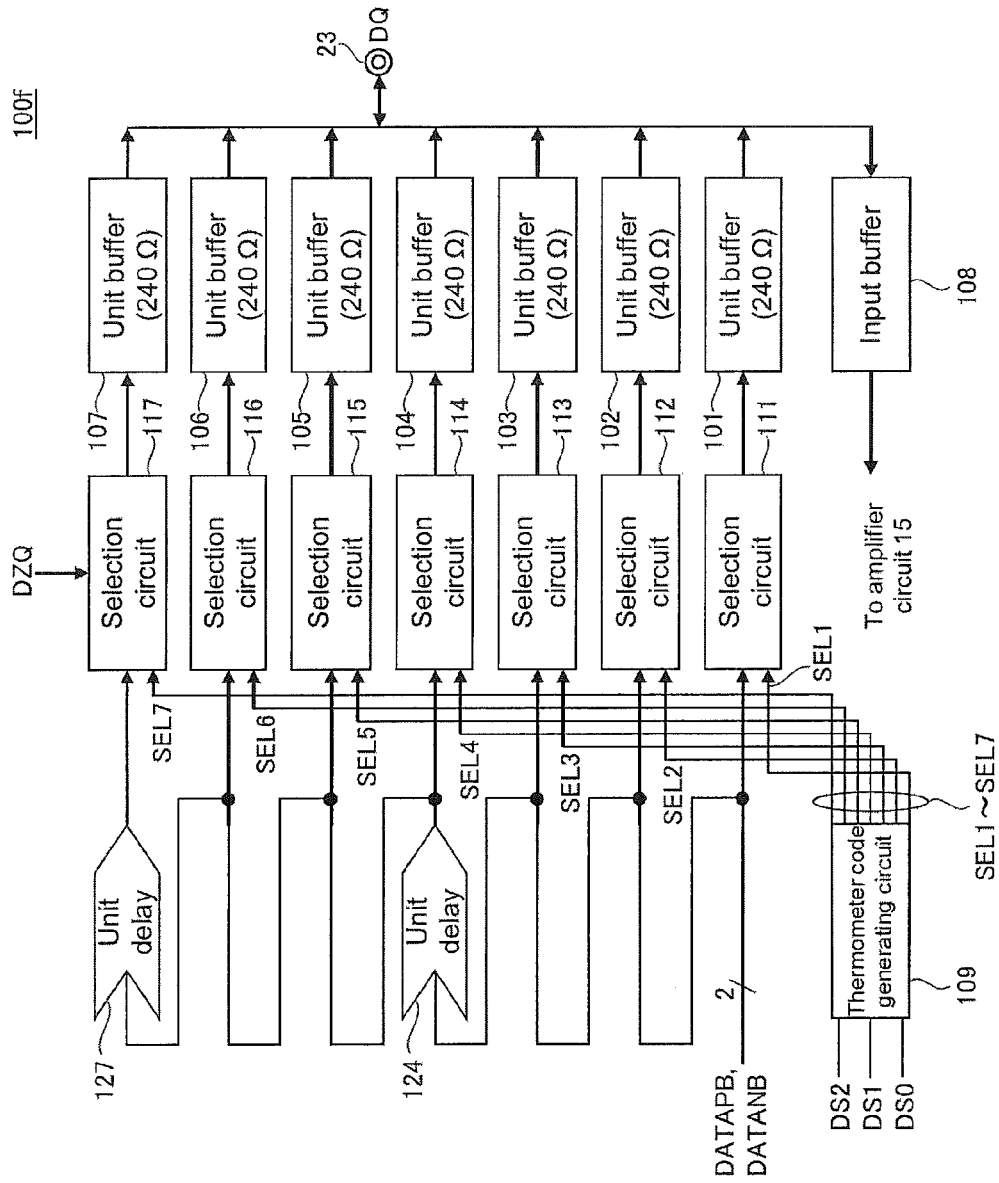
FIG. 30 is a circuit diagram of a data input and output circuit 100f according to a third mode of embodiment of the present invention.

FIG. 30 is a circuit diagram of a data input and output circuit 100f according to the third mode of embodiment of the present invention.

The data input and output circuit 100f according to this mode of embodiment differs from the data input and output circuit 100 according to the first mode of embodiment illustrated in FIG. 3 in that the unit delays 122, 123, 125 and 126 have been omitted. Other points are the same as for the data input and output circuit 100 according to the first mode of embodiment, and therefore the same reference codes are appended to the same elements, and duplicate descriptions are omitted. According to this mode of embodiment, the unit delays 122, 123, 125 and 126 have been omitted, and only two unit delays 124 and 127 are used, and therefore even if all seven unit buffers 101 to 107 are to be activated, the time from when the operation of the unit buffer 101 is switched until the operation of the unit buffer 107 is switched can be set to the amount of delay of two unit delays. However, in this case the operation of the unit buffers 101 to 103 is switched simultaneously, and the operation of the unit buffers 104 to 106 is switched simultaneously, and therefore the peak current dispersion effects are somewhat reduced.

Figure 31:
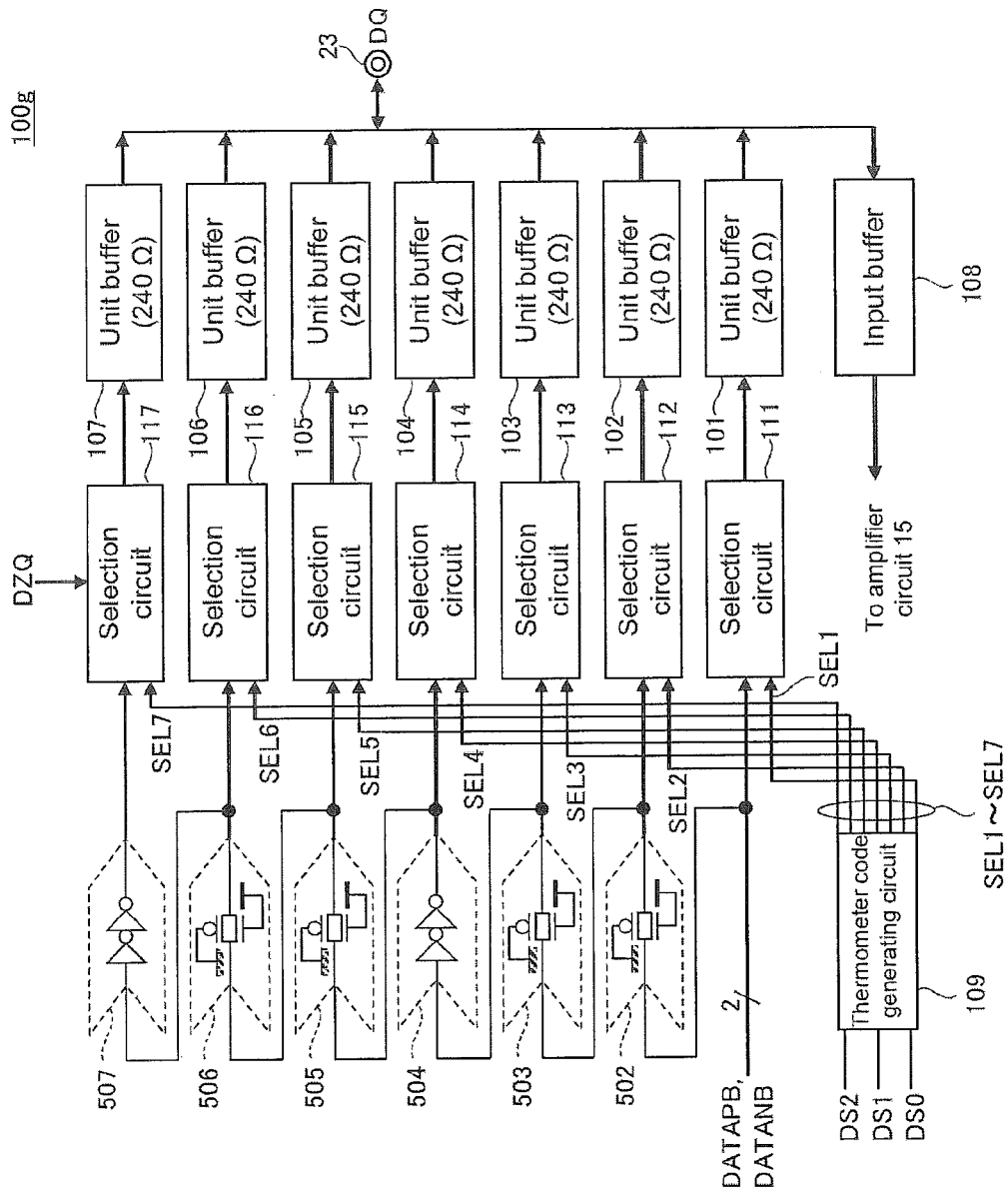
FIG. 31 is a circuit diagram of a data input and output circuit 100g according to a first modified example of the third mode of embodiment.

FIG. 31 is a circuit diagram of a data input and output circuit 100g according to a first modified example of this mode of embodiment.

The data input and output circuit 100g illustrated in FIG. 31 differs from the data input and output circuit 100f illustrated in FIG. 30 in that unit delays 502 to 507 are used. As illustrated in FIG. 31, the unit delays 502, 503, 505 and 506 are transfer gates, and the unit delays 504 and 507 comprise two inverter circuits. The transfer gates are always on, and as an equivalent can be regarded as resistive elements. By being connected to parasitic capacitors generated at the input stages of the selection circuits 111 to 117, for example, said resistive elements form time-constant circuits. Thus a smaller amount of delay than the delay resulting from two inverter circuits can be achieved using the unit delays 502, 503, 505 and 506, and the peak current dispersion effects can be increased.

Figure 32:
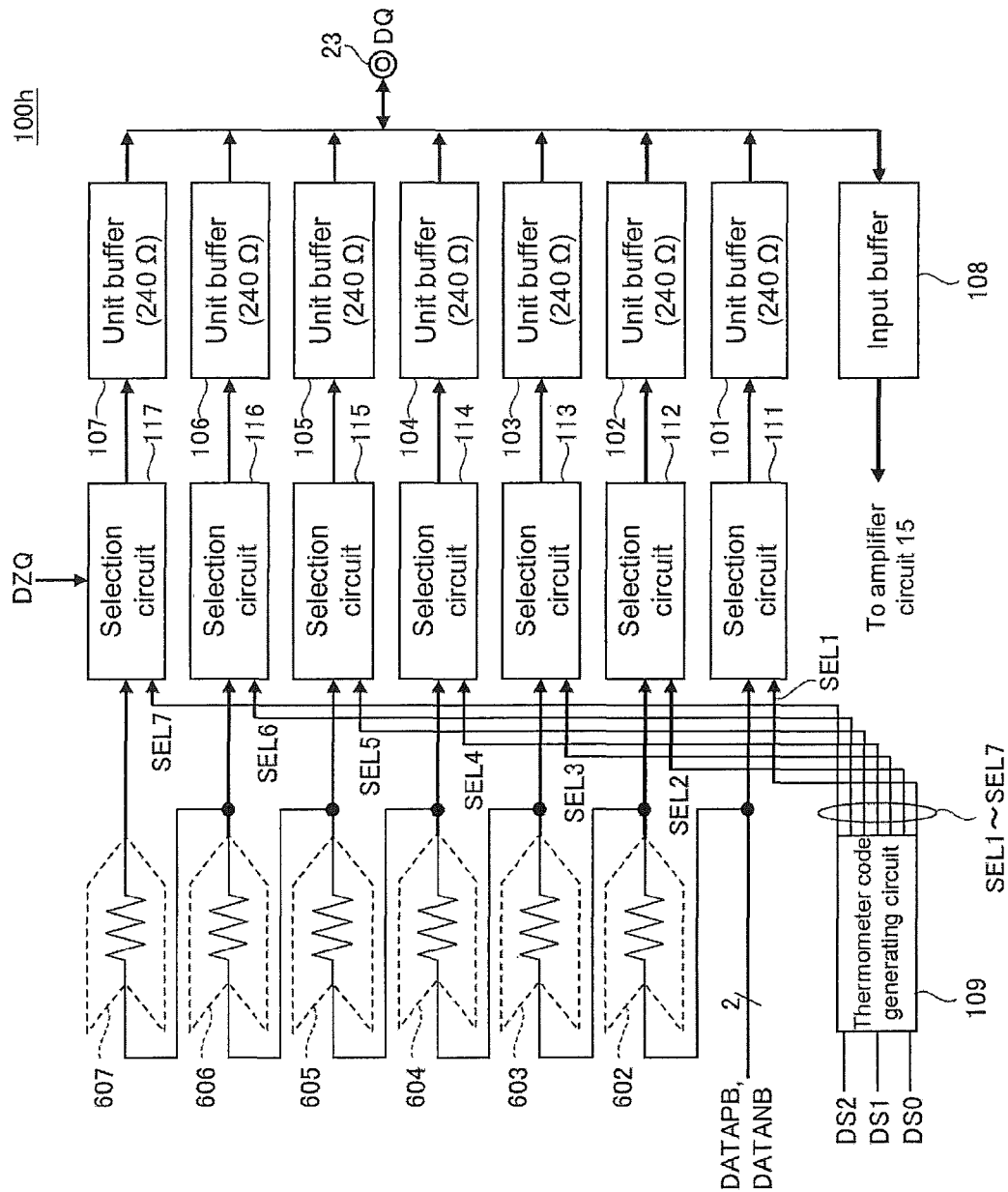
FIG. 32 is a circuit diagram of a data input and output circuit 100h according to a second modified example of the third mode of embodiment.

FIG. 32 is a circuit diagram of a data input and output circuit 100h according to a second modified example of this mode of embodiment.

The data input and output circuit 100h illustrated in FIG. 32 differs from the data input and output circuit 100f illustrated in FIG. 30 in that unit delays 602 to 607 comprising resistive elements are used. As discussed hereinabove, because parasitic capacitors are generated at the input stages of the selection circuits 111 to 117, for example, a slight delay is generated for each pass through one of the resistors. By this means, the difference between the timing with which the operation of the unit buffers 101 to 107 is switched can be made very small.

Figure 33:
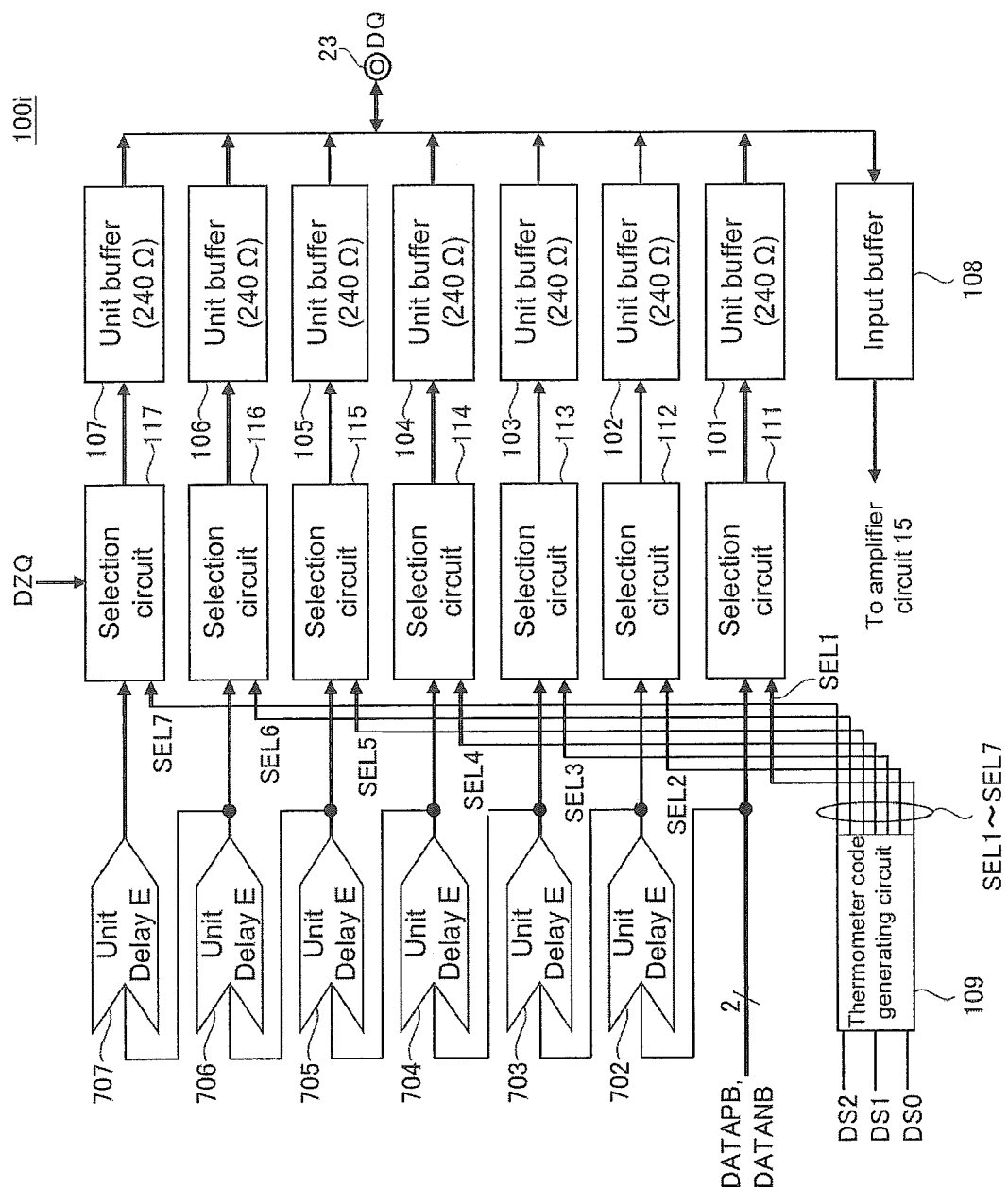
FIG. 33 is a circuit diagram of a data input and output circuit 100i according to a third modified example of the third mode of embodiment.

FIG. 33 is a circuit diagram of a data input and output circuit 100i according to a third modified example of this mode of embodiment.

Figure 34:
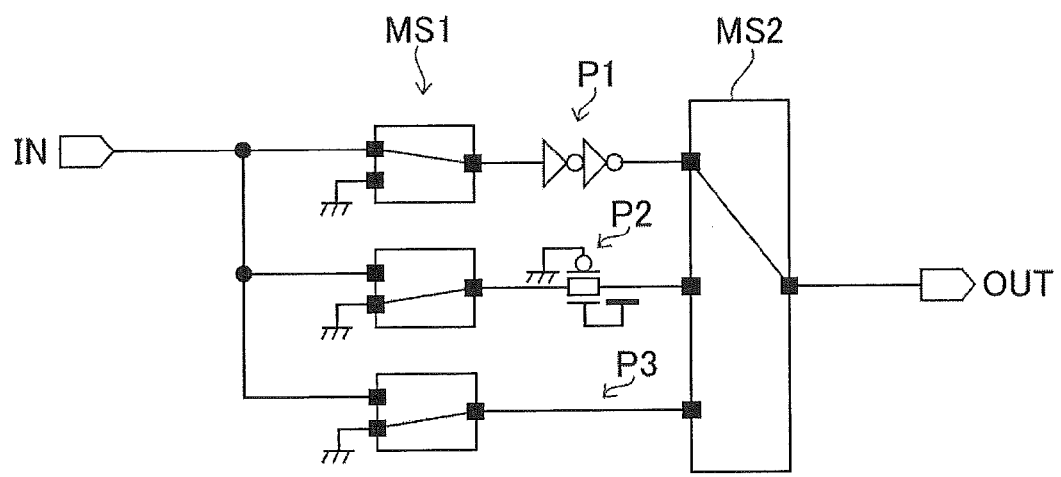
FIG. 34 is a circuit diagram of unit delays 702 to 707.

The data input and output circuit 100i illustrated in FIG. 33 differs from the data input and output circuit 100f illustrated in FIG. 30 in that switchable unit delays 702 to 707 (unit delays E) are used. The circuit configuration of each unit delay 707 to 707 is as illustrated in FIG. 34, three signal paths being allocated between an input node IN and an output node OUT. A first signal path P1 comprises two inverter circuits, a second signal path P2 comprises a transfer gate, and a third signal path P3 simply comprises a wiring line. Which of the signal paths P1 to P3 to use is then selected at the manufacturing stage using master slice portions MS1 and MS2. Thus the characteristics of the data input and output circuit 100i can be modified by switching the master slice portions MS1 and MS2 during the manufacturing stage.

Figure 35:
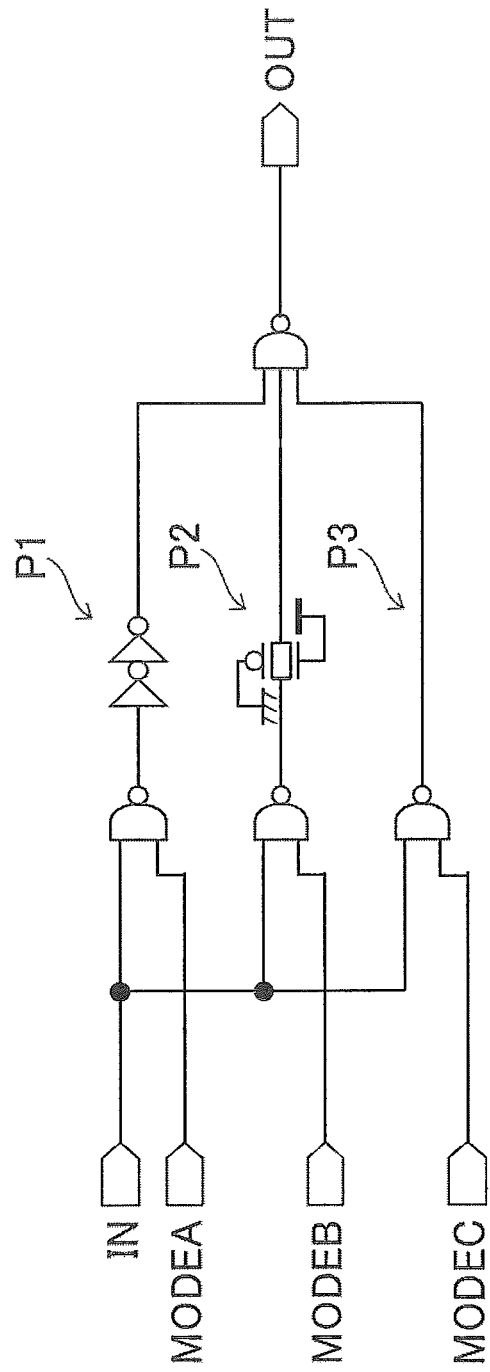
FIG. 35 is a circuit diagram of unit delays 702 to 707 according to a modified example.

Each of the unit delays 702 to 707 may also have the circuit configuration illustrated in FIG. 35. In the circuit illustrated in FIG. 35, the signal paths P1 to P3 are again allocated between the input node IN and the output node OUT, but they are selected using selection signals MODEA to MODEC. This makes it possible for the characteristics of the data input and output circuit 100i to be modified freely, even after manufacture. Further, allocating individual selection signals to each of the unit delays 702 to 707 makes it possible to finely adjust the timing with which the operation of the unit buffers 101 to 107 is switched.

Figure 36:
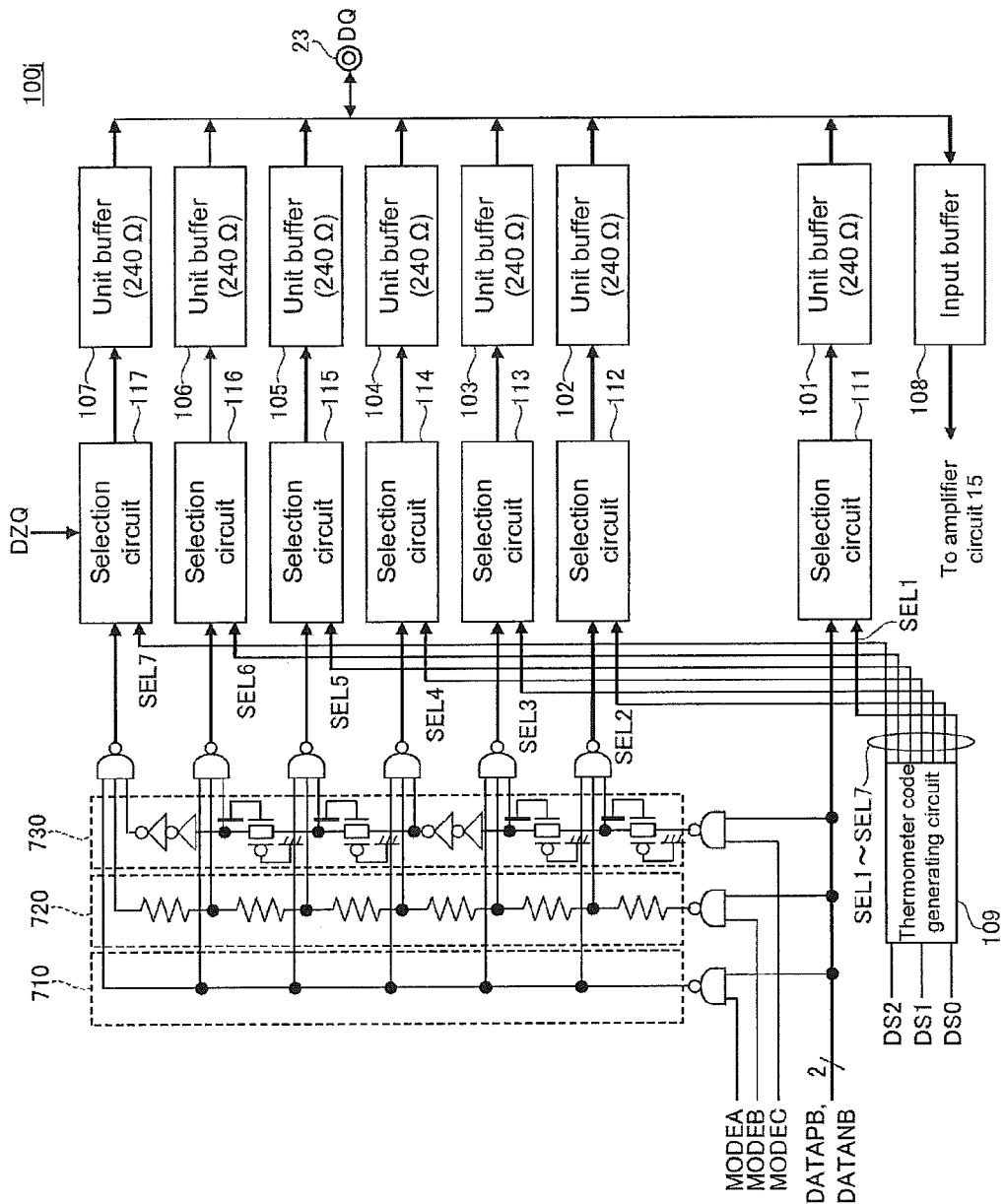
FIG. 36 is a circuit diagram of a data input and output circuit 100j according to a fourth modified example of the third mode of embodiment.

FIG. 36 is a circuit diagram of a data input and output circuit 100j according to a fourth modified example of this mode of embodiment.

The data input and output circuit 100j illustrated in FIG. 36 differs from the data input and output circuit 100f illustrated in FIG. 30 in that either one of delay lines 710, 720 or 730 can be selected by means of the selection signals MODEA to MODEC. The delay line 710 simply comprises a wiring line, and is selected using the selection signal MODEA. The delay line 720 comprises a plurality of resistive elements connected in series, and is selected using the selection signal MODEB. The delay line 730 comprises a plurality of transfer gates and a plurality of elements comprising two inverter circuits, connected in series, and is selected using the selection signal MODEC. This configuration makes it unnecessary for each unit delay to be controlled individually, as in the circuit illustrated in FIG. 35, and it is therefore possible for the characteristics of the data input and output circuit 100j to be modified freely, while simplifying the circuit configuration.

Figure 37:
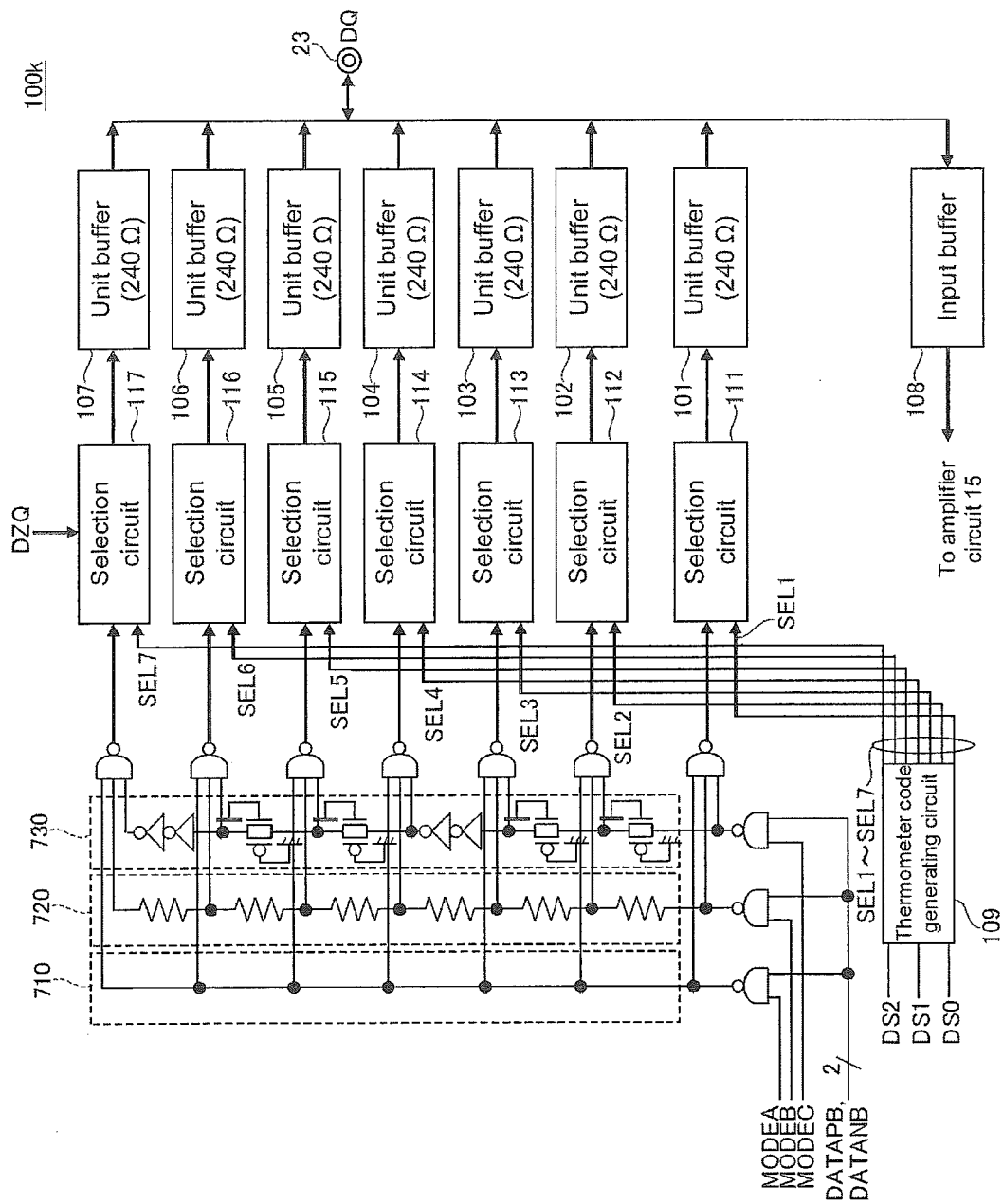
FIG. 37 is a circuit diagram of a data input and output circuit 100k according to a fifth modified example of the third mode of embodiment.

It should be noted that in the data input and output circuit 100j illustrated in FIG. 36, the internal data DATAPB and DATANB supplied to the selection circuit 111 do not pass through the gate circuits that accept the selection signals MODEA to MODEC, but a configuration may also be adopted whereby the internal data DATAPB and DATANB pass through the gate circuits that accept the selection signals MODEA to MODEC and are then supplied to the selection circuit 111, as in a data input and output circuit 100k according to a fifth modified example, illustrated in FIG. 37. This makes it possible for the intervals at which the operations of the unit buffers 101 to 107 are switched to be made more uniform.

Figure 38:
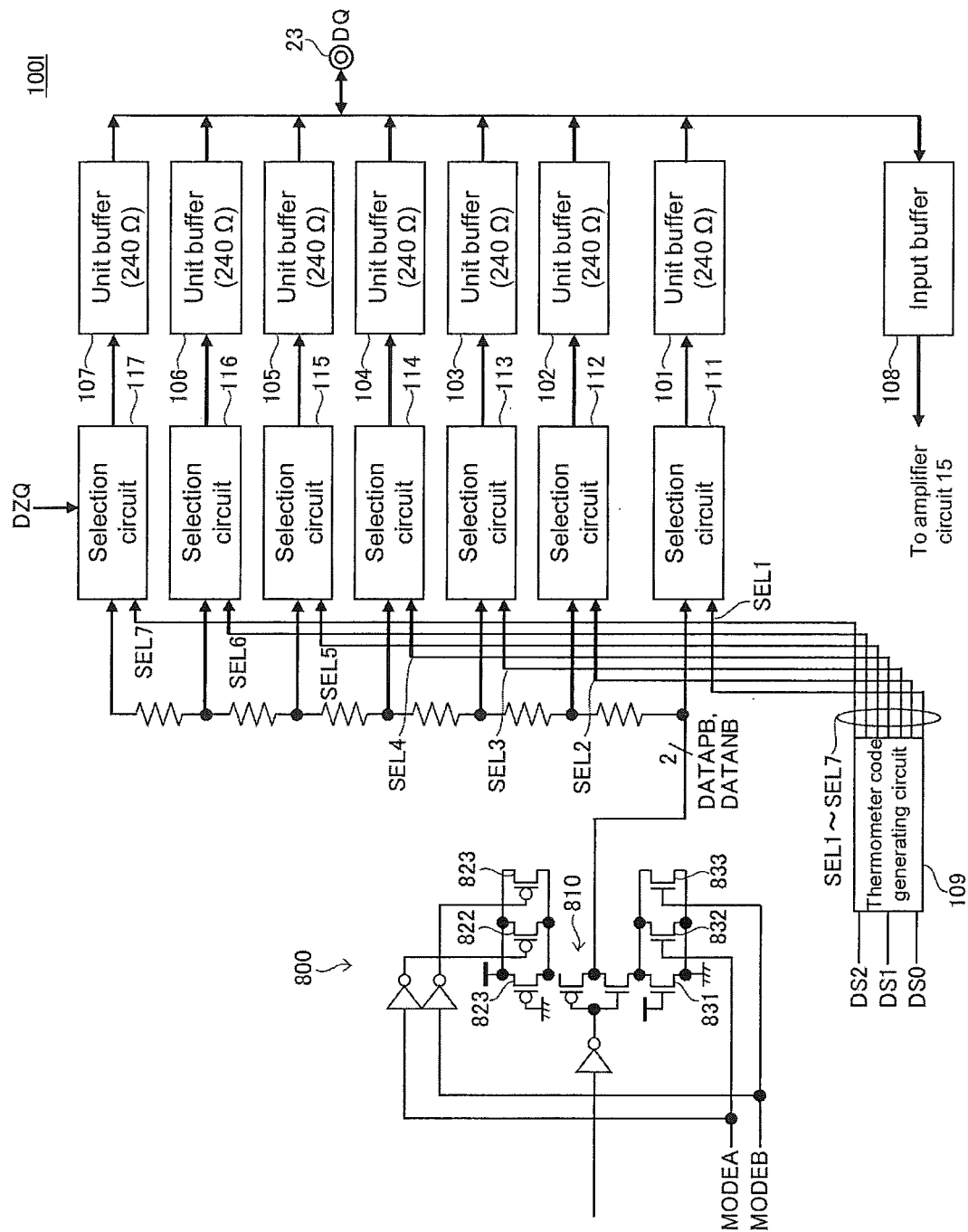
FIG. 38 is a circuit diagram of a data input and output circuit 100l according to a sixth modified example of the third mode of embodiment.

FIG. 38 is a circuit diagram of a data input and output circuit 100l according to a sixth modified example of this mode of embodiment.

The data input and output circuit 100l illustrated in FIG. 38 differs from the data input and output circuit 100h illustrated in FIG. 32 in that a variable buffer circuit 800 which buffers the internal data DATAPB and DATANB has been added. The variable buffer circuit 800 comprises transistors 821 to 823 and 831 to 833 connected to the source of an inverter 810, and of these, the transistors 822 and 832 are controlled by the selection signal MODEA, and the transistors 823 and 833 are controlled by the selection signal MODEB. By means of this configuration, the drive capability of the variable buffer circuit 800 changes depending on the selection signals MODEA and MODEB, and therefore the waveforms of the internal data DATAPB and DATANB which pass through time-constant circuits formed by the unit delays 602 to 607 also change. Therefore the interval at which the operation of the unit buffers 101 to 107 is switched can be adjusted by means of the selection signals MODEA and MODEB.

Preferred modes of embodiment of the present invention have been described hereinabove, but various modifications to the present invention may be made without deviating from the gist of the present invention, without limitation to the abovementioned modes of embodiment, and it goes without saying that these are also included within the scope of the present invention.

EXPLANATION OF THE REFERENCE NUMBERS

10 Semiconductor device
11 Memory cell array
12 Row decoder
13 Column decoder
14 Sensing circuit
15 Amplifier circuit
20 Access control circuit
21 Address terminal
22 Command terminal
23 Data terminal
24 Calibration terminal
25 Mode register
30 Calibration circuit
31, 32 Pull-up replica circuit
33 Pull-down replica circuit
34, 35 Counter circuit
36, 37 Comparator
38, 39 Resistor
100 to 100l Data input and output circuit
101 to 107 Unit buffer
108 Input buffer
109 Thermometer code generating circuit
111 to 117 Selection circuit
111a to 117a Simple buffer
122 to 127, 201 to 207, 302 to 307, 402 to 407, 502 to 507, 602 to 607, 702 to 707 Unit delay
130, 210, 310, 410 Decoder
131 to 137 OR gate circuit
141 to 147, 150, 220, 420, 430 Logic gate circuit
161 to 165 OR gate circuit
171 to 175 AND gate circuit
180, 190 Resistor
181 to 185 Transistor
191 to 195 Transistor
200, 300, 400 Delay control portion
710, 720, 730 Delay line
800 Variable buffer circuit
810 Inverter
821 to 832, 831 to 833 Transistor
SEL1 to SEL7 Thermometer code

The invention claimed is:

1. A semiconductor device comprising:
a data terminal;
a plurality of unit buffers which drive the data terminal and the impedance of which can be adjusted; and
a control circuit which successively switches the operation of at least two unit buffers selected from the plurality of unit buffers, wherein the control circuit contains a plurality of unit delays connected in cascade, and in that the control circuit controls the operational timing of the selected unit buffers on the basis of an internal data signal output from the plurality of unit delays.

2. The semiconductor device as claimed in claim 1, wherein the control circuit successively switches the output from the selected unit buffers from a first logic level to a second logic level.

3. The semiconductor device as claimed in claim 2, wherein the control circuit sets to a high-impedance state the output from the remaining unit buffers which were not selected from the plurality of unit buffers.

4. The semiconductor device as claimed in claim 1, wherein the impedance during operation is the same for each of the plurality of unit buffers.

5. The semiconductor device as claimed in claim 1, wherein each of the plurality of unit delays has the same amount of delay.

6. The semiconductor device as claimed in claim 1, wherein the control circuit varies the operational timing of the selected unit buffers in accordance with the number of selected unit buffers.

7. The semiconductor device as claimed in claim 6, wherein if the number of selected unit buffers is a first number, the control circuit sets to a first time the time from when the operation of a first unit buffer from the selected unit buffers is switched, to when the operation of a second unit buffer is switched, and if the number of selected unit buffers is a second number that is larger than the first number, the control circuit sets to a second time, shorter than the first time, the time from when the operation of the first unit buffer from the selected unit buffers is switched, to when the operation of the second unit buffer is switched.

8. The semiconductor device as claimed in claim 4, wherein each of the plurality of unit delays comprises either a logic gate circuit, a transfer gate or a resistive element.

9. The semiconductor device as claimed in claim 4, wherein at least one of the plurality of unit delays has a variable amount of delay.

10. A semiconductor device wherein:
a data terminal;
a plurality of unit buffers which in a first control state drive the data terminal to a first logic level, in a second control state drive the data terminal to a second logic level that is different from the first logic level, and in a third control state adopt a high-impedance state as seen from the data terminal;
a selection circuit which sets two or more unit buffers selected from the plurality of unit buffers to either one of the first and second control states, and sets the remaining unit buffers that have not been selected to the third control state; and
a control circuit which successively switches the selected unit buffers from said one of the first and second control states to the other of the first and second control states, wherein the control circuit includes a unit delay which defines a time from when a first unit buffer from the selected unit buffers is switched from one of the first and second control states to the other of the first and second control states, to when a second unit buffer is switched from one of the first and second control states to the other of the first and second control states.

11. The semiconductor device as claimed in claim 10, wherein the impedance of each of the plurality of unit buffers is adjustable, the impedances in the first control state are the same as each other, and the impedances in the second control state are the same as each other.

12. A semiconductor device wherein:
1st to nth unit buffers commonly connected to a data terminal;
a control circuit which switches an output logic level of the 1st to the mth (where m is an integer at least equal to 2 and at most equal to n) unit buffers in this order; and
a code-generating circuit which specifies the value of m, wherein the control circuit contains a delay control portion comprising a plurality of unit delays which are provided corresponding respectively to at least the kth (where k is an integer at least equal to 1 and less than n) to the jth (where j is an integer at least equal to k+1 and at most equal to n) unit buffers, and which are mutually connected in cascade, an internal data signal is input into the delay control portion, and the kth to the jth unit buffers switch their output logic levels in accordance with the internal data signals output respectively from the kth to the jth unit delays.

13. A semiconductor device comprising:
a data terminal;
a plurality of unit buffers which drive the data terminal and the impedance of which can be adjusted; and
a control circuit which successively switches the operation of at least two unit buffers selected from the plurality of unit buffers, wherein the control circuit varies the operational timing of the selected unit buffers in accordance with the number of selected unit buffers, wherein if the number of selected unit buffers is a first number, the control circuit sets to a first time the time from when the operation of a first unit buffer from the selected unit buffers is switched, to when the operation of a second unit buffer is switched, and if the number of selected unit buffers is a second number that is larger than the first number, the control circuit sets to a second time, shorter than the first time, the time from when the operation of the first unit buffer from the selected unit buffers is switched, to when the operation of the second unit buffer is switched.

* * * * *